US012749307B2

(12) United States Patent
Kanagaraj et al.

(10) Patent No.: US 12,749,307 B2
(45) Date of Patent: Sep. 29, 2026

(54) CAMERA APPARATUS AND METHOD OF ENHANCED FOLIAGE DETECTION

(71) Applicant: Tartan Aerial Sense Tech Private Limited, Bangalore (IN)

(72) Inventors: Dhivakar Kanagaraj, Karur (IN); Pranav M P, Bengaluru (IN); Raghul Raghu, Madurai (IN); Prakash Mathews Pothen, Thiruvalla (IN)

(73) Assignee: Tartan Aerial Sense Tech Private Limited, Bangalore (IN)

( * ) Notice: Subject to any disclaimer, the term of this patent is extended or adjusted under 35 U.S.C. 154(b) by 287 days.

(21) Appl. No.: 18/767,934

(22) Filed: Jul. 9, 2024

(65) Prior Publication Data

US 2025/0131539 A1 Apr. 24, 2025

Related U.S. Application Data

(63) Continuation of application No. 18/401,054, filed on Dec. 29, 2023, now Pat. No. 12,062,159.

(30) Foreign Application Priority Data

Oct. 19, 2023 (IN) ............................ 202341071593

(51) Int. Cl.
*G06V 20/10* (2022.01)
*G06T 3/4015* (2024.01)
(Continued)

(52) U.S. Cl.
CPC .......... *G06V 20/188* (2022.01); *G06T 3/4015* (2013.01); *G06T 5/40* (2013.01);
(Continued)

(58) Field of Classification Search
CPC .... G06T 5/70; G06T 5/40; G06T 5/60; G06T 7/11; G06T 7/136; G06T 7/155;
(Continued)

(56) References Cited

U.S. PATENT DOCUMENTS 11,622,744 B2 * 4/2023 Faghih .................. A61B 8/085 600/447
2007/0223812 A1 * 9/2007 Ito ........................ G06V 40/165 348/222.1

(Continued)

OTHER PUBLICATIONS

Manpreet et al., ("Automatic Crop Furrow Detection for Precision Agriculture"), IEEE, pp. 520-523, 2018) (Year: 2018).*

*Primary Examiner* — Amara Abdi
(74) *Attorney, Agent, or Firm* — Barta Jones, PLLC

(57) ABSTRACT

A camera apparatus acquires an input color image of an agricultural field and generates a first binary mask image from the input color image. The first binary mask image includes one or more foliage masks indicative of a presence of one or more foliage regions in a field-of-view with a first accuracy level. One or more morphology operations are applied to remove noise in the first binary mask image and one or more image regions that meet a defined criteria to be considered as foliage are identified. An output binary mask image of foliage mask is generated, which is set as a ground truth to train a custom neural network model in a training phase. The trained custom neural network model is operated to detect one or more other foliage regions in a new color image captured by the camera apparatus in a real time or near real time.

20 Claims, 26 Drawing Sheets

(51) Int. Cl.

| | |
|---|---|
| ***G06T 5/40*** | (2006.01) |
| ***G06T 5/60*** | (2024.01) |
| ***G06T 5/70*** | (2024.01) |
| ***G06T 7/11*** | (2017.01) |
| ***G06T 7/136*** | (2017.01) |
| ***G06T 7/155*** | (2017.01) |
| ***G06T 7/194*** | (2017.01) |
| ***G06T 7/90*** | (2017.01) |
| ***G06T 11/60*** | (2006.01) |
| ***G06V 10/25*** | (2022.01) |
| ***G06V 10/26*** | (2022.01) |
| ***G06V 10/30*** | (2022.01) |
| ***G06V 10/56*** | (2022.01) |
| ***G06V 10/764*** | (2022.01) |
| ***G06V 10/77*** | (2022.01) |
| ***G06V 10/774*** | (2022.01) |
| ***G06V 10/776*** | (2022.01) |
| ***G06V 10/82*** | (2022.01) |
| ***H04N 1/60*** | (2006.01) |
| ***H04N 9/73*** | (2023.01) |
| ***H05K 1/181*** | (2026.01) |
| *H04N 23/84* | (2023.01) |

(52) U.S. Cl.

CPC .................. *G06T 5/60* (2024.01); *G06T 5/70* (2024.01); *G06T 7/11* (2017.01); *G06T 7/136* (2017.01); *G06T 7/155* (2017.01); *G06T 7/194* (2017.01); *G06T 7/90* (2017.01); *G06T 11/60* (2013.01); *G06V 10/25* (2022.01); *G06V 10/26* (2022.01); *G06V 10/273* (2022.01); *G06V 10/30* (2022.01); *G06V 10/56* (2022.01); *G06V 10/764* (2022.01); *G06V 10/7715* (2022.01); *G06V 10/774* (2022.01); *G06V 10/7747* (2022.01); *G06V 10/776* (2022.01); *G06V 10/82* (2022.01); *H04N 1/6002* (2013.01); *H04N 9/73* (2013.01); *H05K 1/181* (2013.01); *G06T 2207/10024* (2013.01); *G06T 2207/20032* (2013.01); *G06T 2207/20036* (2013.01); *G06T 2207/20081* (2013.01); *G06T 2207/20084* (2013.01); *G06T 2207/30188* (2013.01); *G06V 2201/07* (2022.01); *H04N 23/84* (2023.01); *H05K 2201/10121* (2013.01); *H05K 2201/10151* (2013.01); *H05K 2201/10159* (2013.01)

(58) Field of Classification Search

CPC . G06T 7/194; G06T 7/90; G06T 2207/10024; G06T 2207/20032; G06T 2207/20036; G06T 2207/20081; G06T 2207/20084; G06T 2207/30188; G06V 20/188; H04N 23/84

See application file for complete search history.

(56) References Cited

U.S. PATENT DOCUMENTS

| | | | | |
|---|---|---|---|---|
| 2009/0141937 | A1* | 6/2009 | Abe | H04N 23/635 382/103 |
| 2013/0034263 | A1* | 2/2013 | Ding | G06V 10/7715 382/103 |
| 2017/0262962 | A1* | 9/2017 | Rad | G06F 17/18 |
| 2018/0300620 | A1* | 10/2018 | Gerardo Castro | G01S 13/862 |
| 2019/0180445 | A1* | 6/2019 | Aggarwal | G06T 7/136 |
| 2020/0413070 | A1* | 12/2020 | Huang | H04N 19/17 |
| 2022/0084166 | A1* | 3/2022 | Navarrete Michelini | G06T 3/4046 |
| 2022/0132089 | A1* | 4/2022 | Skorka | H04N 17/002 |
| 2024/0365769 | A1* | 11/2024 | Roberts | G06T 7/90 |

* cited by examiner

CAMERA APPARATUS AND METHOD OF ENHANCED FOLIAGE DETECTION

CROSS-REFERENCE TO RELATED APPLICATIONS/INCORPORATION BY REFERENCE

This Patent Application makes reference to, claims priority to, claims the benefit of, and is a Continuation Application of U.S. patent application Ser. No. 18/401,054, filed on Dec. 29, 2023, which claims priority to an Indian Provisional Patent Application No. 202341071593, filed on Oct. 19, 2023.

The above referenced Applications are hereby incorporated herein by reference in their entirety.

FIELD OF TECHNOLOGY

Certain embodiments of the disclosure relate to agricultural machines and systems. More specifically, certain embodiments of the disclosure relate to a camera apparatus, and a method of enhanced foliage detection.

BACKGROUND

With the rapid advancement of machines, agricultural implements, special-purpose vehicles, and vehicle mounted apparatus, productivity in agricultural operations has increased. However, existing vehicle-based agricultural systems are very complex in nature, where a particular system or machinery works only when it is from the same manufacturer. In other words, one system of one manufacturer is not compatible with another system of another manufacturer. This binds a farmer to use costly machineries and agricultural implements of one specific manufacturer as crosstalk among different electronics and mechatronics systems is generally restricted or severely limited in use.

Furthermore, modern agronomy makes the use of the best technological devices and techniques to increase the yield. Foliage detection plays a crucial role in camera-driven agricultural solutions due to its significant impact on farm upkeep and automation. For example, the foliage detection finds application in targeted weed control, real-time crop monitoring, monitoring irrigation needs, identifying patterns and trends in crop growth, selective harvesting, automatic camera-driven operation of various agricultural tools or implements (e.g., sprayers, cutters, harvesters etc.) attached to agricultural machines, and/or in other camera-driven agricultural solutions. However, in the realm of camera technology for foliage detection in agricultural fields, several technical problems persist, hindering the accuracy and efficacy of these systems. In a first example, unlike controlled settings, agricultural fields are often uneven, with varying terrain, obstacles, and clutter. This complexity makes it challenging for cameras to identify specific patterns or features of foliage. In a second example, conventional cameras are often calibrated for standard environments, making them less effective in the unique conditions of agricultural fields. This can lead to issues with color accuracy, perspective distortion, and image clarity. Examples of the unique conditions of agricultural fields include but are not limited to, a) the sunlight variation issue, i.e., sunlight constantly changes throughout the day, causing shadows, reflections, and variations in brightness; b) using only green color pixels in conventional camera systems and methods for foliage detection are found to be misleading leading to misidentification by cameras. This can make it difficult for cameras to accurately distinguish between foliage and other objects. For example, traditionally, a green color detector is used to detect the foliage in the agricultural field. However, the green color detector has certain limitations, such as lack of precision in distinguishing different shades of green, found in nature. This limitation extends beyond detecting green pixels to lacking the ability of distinguishing the true foliage from other potential visual noises that may introduce unwanted data into the foliage detection. For instance, during the chemical spray operations in the agricultural field, a mist is usually created which gets coupled with light scattering effects and led to formation of a rainbow-like phenomenon in camera field-of-view. Therefore, the conventional green color detector may erroneously identify the non-foliage noise as green color and create false positives.

In another example, variations in lighting conditions especially when operating in agricultural environments, possess challenges of lighting induced color shifts. Consequently, the appearance of normal green hues is transformed to yellowish tones, leading to miss the identification of genuine foliage. Therefore, the conventional green color detector lacks the ability to perform in diverse and dynamic lighting conditions. Furthermore, the conventional camera devices or systems mostly fail when operating in agricultural environments due to dynamic agricultural environments. The issues of mist created rainbow-like phenomenon in camera field-of-view, sunlight variation, shadow-on-plant, objects like pipes in agricultural fields causes such conventional camera systems to fail.

In yet another example, there is a problem of over-engineering, i.e., too many sensor units, too much processing, and very complex machines. In such a situation, the chances of errors are high due to multiple failure points and at the same time makes such machines very costly, power intensive, and processing intensive, which are not suited for many sub-urban, urban, or rural farming conditions and needs. For instance, some existing systems use chlorophyll sensors or detectors to supplement or corroborate the visible-spectrum image-sensors.

Further limitations and disadvantages of conventional and traditional approaches will become apparent to one of skill in the art through comparison of such systems with some aspects of the present disclosure as set forth in the remainder of the present application with reference to the drawings.

BRIEF SUMMARY OF THE DISCLOSURE

A camera apparatus and a method of enhanced foliage detection, substantially as shown in and/or described in connection with at least one of the figures, as set forth more completely in the claims. The disclosed camera apparatus and method provides significant improvement over conventional camera systems that employ conventional green color detectors. The disclosed camera apparatus and method significantly improves the accuracy and reliability of foliage detection by being able to identity foliage in different shades of green color, like yellowish-green, reddish-green, blueish-green, and the like, without increasing image processing complexity and latency in foliage detection. The disclosed camera apparatus and the method eliminates potential interferences induced from visual noises (e.g., mist issue due to spraying of chemicals which create rainbow-like phenomenon in camera field-of-view, sunlight variation, shadow-on-plant, grey or green looking objects like pipes in agricultural fields) and accounts dynamic lighting conditions during foliage detection.

These and other advantages, aspects and novel features of the present disclosure, as well as details of an illustrated embodiment thereof, will be more fully understood from the following description and drawings.

BRIEF DESCRIPTION OF DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those skilled in the art will understand that the drawings are not to scale. Wherever possible, like elements have been indicated by identical numbers.

Embodiments of the present disclosure will now be described, by way of example only, with reference to the following diagrams wherein.

DETAILED DESCRIPTION OF THE DISCLOSURE

Certain embodiments of the disclosure may be found in a camera apparatus, and a method of enhanced foliage detection. The disclosed camera apparatus and the method improves accuracy and reliability of foliage detection over conventional foliage detection systems and methods. Typically, conventional camera systems employ green color detectors that focus on merely detecting the green color pixels in captured images for foliage detection. Most green detectors are trained on general green colors, not specifically for foliage. This lack of agricultural domain-specific knowledge makes them less sensitive to the subtle variations in reflectance and color distribution found in natural agricultural environments. Moreover, real-world scenes, especially foliage, contain complex variations in lighting and surface texture. Bright sunlight hitting leaves can create highlights with high green and yellow values, while shadows might have lower green values with more blue or brown hues. These inconsistencies within the same "green" object make it difficult for detectors to establish a consistent method for green detection. Furthermore, digital images typically use the RGB (Red, Green, Blue) color space, where each pixel has three values ranging from 0 to 255 representing the intensity of each color. However, green shades in foliage occupy a broad range within the RGB space, overlapping with other greens, yellows, and even blues depending on lighting and shadows. This overlap makes it challenging for simple algorithms to definitively distinguish between distinct shades.

In contrast to the conventional green color detectors, the camera apparatus and the method of the present disclosure enables detection of the green color as well as different shades of the green color, for example, yellowish green color, bluish green color, reddish green color, and the like, which in turn significantly improves the reliability and accuracy of foliage detection in agricultural environments. Moreover, the camera apparatus and the method of the present disclosure enables an isolation between various shades of the green color, which are indicative of foliage, while eliminating the effect of potential visual noises (e.g., identification of non-foliage as foliage due to mist created by chemical spraying that causes the rainbow-phenomenon, sunlight variation causing misidentification of genuine foliage due to diverse and dynamic lighting conditions, shadow-on-plants, green or gray colored pipes in agricultural fields, which may be misidentified as foliage part and the like).

In the following description, reference is made to the accompanying drawings, which form a part hereof, and in which is shown, by way of illustration, various embodiments of the present disclosure.

Figure 1A:
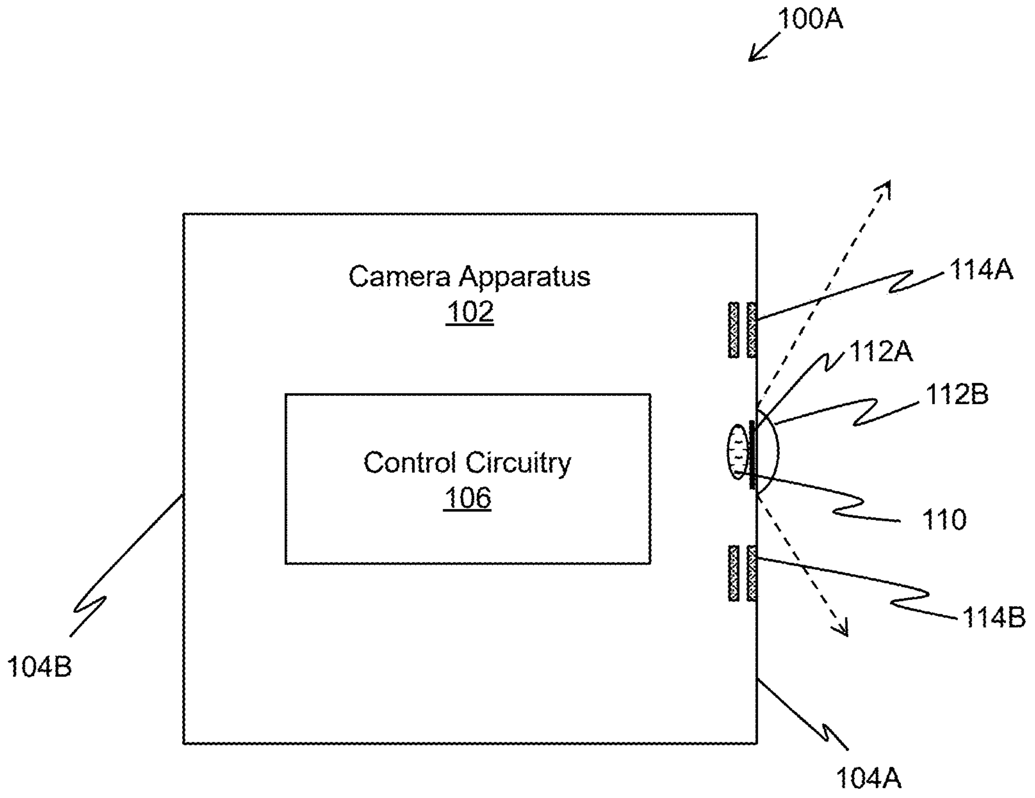
FIG. 1A is a diagram illustrating various exemplary components of a camera apparatus, in accordance with an embodiment of the present disclosure.

FIG. 1A is a diagram illustrating various exemplary components of a camera apparatus, in accordance with an embodiment of the present disclosure. With reference to FIG. 1A, there is shown a diagram 100A of a camera apparatus 102. The camera apparatus 102 may have a front side 104A and a rear side 104B. The camera apparatus 102 may include control circuitry 106. Furthermore, the front side 104A of the camera apparatus 102 may include an image sensor 110, a lens 112A, a lens protector 112B, and a plurality of light diffusers, such as a first light diffuser 114A and a second light diffuser 114B.

In an exemplary implementation, the camera apparatus 102 may be mounted in a vehicle, such as a tractor or any other agricultural vehicle. The camera apparatus 102 is configured to capture an input color image (e.g., a color image that captures a portion (e.g., 1.75-2.25 meters or approximately 2 meters) of an agricultural field comprising soil and foliage (e.g., plants that may include weeds and crop plants, hereinafter simply referred to as a foliage image) of an agricultural field. In an implementation, the camera apparatus 102 is configured to capture a wide field-of-view (FOV), for example, 1.75 to 2.25 meters of a physical agricultural field as compared to smaller FOV in conventional systems (typically less than 1.5 meters). In an implementation, the FOV corresponds to approximately 2 meters of the agricultural field. The FOV of the camera apparatus 102 is represented by dotted lines in FIG. 1A. In an implementation, the camera apparatus 102 may be oriented at a specific angle (e.g., 45 degree or) 60° in order to capture a few metres in forward as well as in downward direction, for example, up to 80-90 cm downwards or up to 1.7 to 2.25 metres ahead.

The control circuitry 106 may include suitable logic, circuitry, interfaces and/or code that is configured to acquire an input color image of a FOV of an agricultural field. Examples of the control circuitry 106 may include, but are not limited to a system-on-module (SOM) processor, an integrated circuit, a co-processor, a microprocessor, a microcontroller, a complex instruction set computing (CISC) processor, an application-specific integrated circuit (ASIC) processor, a reduced instruction set (RISC) processor, a very long instruction word (VLIW) processor, a central processing unit (CPU), a state machine, a data processing unit, and other processors or circuits. Moreover, the control circuitry 106 may refer to one or more individual processors, processing devices, a processing unit that is part of a machine.

In accordance with an embodiment, the front side 104A of the camera apparatus 102 may further comprise the lens 112A and the lens protector 112B that covers the lens 112A and the image sensor 110 of the camera apparatus 102. Alternatively stated, the lens 112A is positioned between the image sensor 110 and the lens protector 112B. The lens protector 112B may be configured as a filter screen to prevent dust particles and ultra-violet (UV) light from entering the image sensor 110 of the camera apparatus 102. The lens protector 112B may also be referred to as a lens protection filter that further protects from fogging. In an implementation, the lens protector 112B may be an anti-fogging glass that also protects the lens 112A and the image sensor 110 from dust, spray mist, and UV light.

In accordance with an embodiment, each of the first light diffuser 114A and the second light diffuser 114B may be configured to diffuse light emitted from a plurality of light sources, when the camera apparatus 102 is in operation to capture the input color image. The plurality of light sources may include, but not limited to, light emitting devices (LED), strobe-lights integrated in a light control printed circuit board (PCB). The light control PCB further comprises capacitors to power the LED or strobe-lights (not shown for brevity). In an implementation, the rear side 104B of the camera apparatus 102 may comprise a passive heat sink (not shown) to dissipate heat generated by the control circuitry 106 (e.g., the SOM processor) of the camera apparatus 102.

In operation, the image sensor 110 may be configured to capture an input color image of an agricultural field in a defined field-of-view (FOV), for example, 2 meters of the agricultural field that may include a substrate (such as soil) and foliage growing on the substrate. The control circuitry 106 is configured to smoothen the input color image with a median blur. During smoothening of the input color image, illumination differences present in the input color image are eliminated and a smoothened input color image is generated which has even brightness. For example, illumination differences, such as uneven lighting or shadows, may be present in the input color image. The control circuitry 106 applies a median blur filter to the input color image, where the filter works by sliding a small window (kernel) across the image, pixel by pixel and by replacing pixels with median values from their neighboring pixels within the window, which evens out brightness variations. The benefit of smoothening the input color image with the median blur is that it makes the image less sensitive to extreme pixel values, making it robust against outliers.

The control circuitry 106 is further configured to convert the smoothened input color image into a plurality of different color spaces. The smoothened input color image is converted into the plurality of difference color spaces, such as a LAB color space, a RGB color space, and the like, where a first color space of the plurality of difference color spaces is a LAB color space and a second color space of the plurality of difference color spaces is a RGB color space. Different color spaces represent colors in distinct ways, making certain features more visible or easier to isolate. For example, LAB color space separates color information (AB channels) from lightness (L channel), aiding in color segmentation, whereas RGB color channel directly represents red, green, and blue components, useful for defining color ranges. Thus, using multiple color spaces offers adaptability to diverse foliage types and imaging scenarios.

The control circuitry 106 is further configured to execute a set of channel operations on an individual channel or combined channels in each color space of the plurality of different color spaces to enhance green pixels and suppress other pixels, wherein the green pixels are indicative of foliage in the FOV. The control circuitry 106 is configured to execute the set of channel operations either on the individual channel (e.g., L channel of the LAB color space) or on the combined channels (e.g., R and G channels of the RGB color space) to enhance green pixels and to suppress other pixels. Each color space may be processed in a separate processing path, referred to as a color space processing path. Thus, each color space processing path associated with a corresponding color space of the plurality of different color spaces may be processed in parallel (concomitantly). The ability to operate with individual or combined channels in different color spaces offers flexibility to address varying foliage types and imaging conditions. The set of channel operations are shown and described in detail, for example, in FIGS. 6 and 7 (more specifically, in operations 606, 608, 618 and 620 of FIG. 6, and operations 706, 708, 712 and 714 of FIG. 7).

In accordance with an embodiment, the control circuitry 106 is further configured to segregate each component of the LAB color space for the smoothened input color image. Each component (i.e., L, A and B) of the LAB color space is segregated for further processing of the smoothened input color image. The L-component represents lightness on a scale from 0 (i.e., black) to 100 (i.e., white). The A-component represents a green-red opponent channel, where positive values indicate redness and negative values indicate greenness. The B-component represents a blue-yellow opponent channel, where positive values indicate yellowness and negative values indicate blueness. The control circuitry is further configured to utilize the L-component representing lightness of the LAB color space of the input color image as an input for the identification of the one or more image regions that meet the defined criteria to be considered as the foliage. Alternatively stated, the L-component is used to normalize any variation that is happening in illumination. By focusing on L-component, the control circuitry 106 may be configured to mitigate the effects of varying illumination levels, making foliage detection more robust to lighting changes and further complements color-based segmentation when combined with another color channel, say RGB.

In accordance with an embodiment, the control circuitry is further configured to utilize the A-component representing a green-red opponent channel of the LAB color space for the execution of the set of channel operations in a first color space processing path associated with the first color space. The LAB color space processing is handled within a distinct path, separate from other color spaces. The A-component provides a higher contrast between green and red pixels of the input color image. The channel operations on the A-component enhance foliage visibility and reduce noise. The set of channel operations (e.g., conversion of image values in floating point format) are executed in the first color space processing path associated with the first color space (i.e., the LAB color space), described in detail, for example, in FIGS. 6 and 7. The floating-point format may be a way of storing and representing numerical values using a format that accommodates a wider range of numbers and decimal places, compared to integer formats. For example, a floating-point format of 32-bit floats may be used. Integer formats are prone to overflow (values exceeding their maximum capacity) and underflow (values becoming too small to represent). Thus, floating-point format handles much larger and smaller values gracefully, reducing the likelihood of numerical errors during calculations. For example, consider adjusting a pixel's A-value from 0.5 to 0.51 for subtle contrast enhancement. Integer format may round 0.51 to 0.5, negating the intended adjustment. Floating-point format accurately represents 0.51, enabling the desired change, thereby allowing precise manipulations of pixel values in the A-component for enhanced foliage detection.

In accordance with an embodiment, the control circuitry 106 is further configured to segregate each component of the RGB color space for the smoothened input color image. Each component (i.e., R, G, and B) of the RGB color space is segregated for the smoothened input color image. The control circuitry 106 is further configured to compute a first difference between a green channel intensity and a red channel intensity and a second difference between the green channel intensity and a blue channel intensity, respectively for the segregated components of the RGB color space. The control circuitry is configured to compute the first difference (i.e., G−R) between the green channel intensity (G) and the red channel intensity (R) and the second difference (i.e., G−B) between the green channel intensity (G) and the blue channel intensity (B), respectively, for segregated components of the RGB color space. In the first difference (i.e., G−R) between the green channel intensity (G) and the red channel intensity (R), the positive pixel values indicate a dominance of green, often characteristic of foliage. Similarly, in the second difference (i.e., G−B) between the green channel intensity (G) and the blue channel intensity (B), the positive pixel values again suggest a stronger green presence, reinforcing foliage likelihood. In an example, analyzing the magnitudes of G−R and G−B can help distinguish between different foliage types in terms of different shades of green.

In accordance with an embodiment, the control circuitry 106 is further configured to sum the first difference (i.e., G−R) and the second difference (i.e., G−B) to obtain a summed output (i.e., (G−R)+ (G−B)) and use the summed output for the execution of the set of channel operations in a second color space processing path associated with the second color space. By combining the two differences, the summed output (i.e., (G−R)+ (G−B)) creates a more robust indicator of foliage presence (i.e., an enhanced foliage signal), even in challenging lighting conditions or with variations in foliage green-colors. Furthermore, the summed output condenses foliage-related information into a single value (representing the overall strength of green relative to red and blue), simplifying subsequent processing steps and reducing computational overhead. For example, pixels with negative summed output may be efficiently eliminated from the summed output as they are unlikely to represent foliage. This operation may be also referred to as negatives values correction or simply negatives correction. The negative values are observed to be associated with noise or non-foliage elements, so removing them improves detection accuracy. For example, consider a pixel with (G−R)=40 and (G−B)=30. The summed output would be 70, strongly suggesting foliage. Further, a pixel with (G−R)=−10 and (G−B)=5 would have a summed output of −5, indicating a low probability of foliage and potential exclusion. The summed output (i.e., (G−R)+ (G−B)) is used in execution of the set of channel operations (e.g., operations 622 and 624 of FIG. 6) in the second color space processing path associated with the second color space.

The control circuitry 106 is further configured to generate a normalized image with enhanced green pixels based on outputs received from each color space processing path associated with the plurality of different color spaces. In an implementation scenario, the normalization may be done within a range of 0 to 200, which means each pixel value in the image is adjusted to fall within the range of 0 to 200. This ensures consistency and comparability across different colors and images. The normalization is done based on the outputs received from each color space processing path. This ensures that the normalization is consistent across different color spaces. Normalization ensures that the pixel values in an image are consistent and comparable for each color space processing path associated with the plurality of different color spaces, even if they were captured under different lighting conditions.

The control circuitry 106 is further configured to determine a threshold value based on a histogram of the normalized image and apply the determined threshold value to generate a first binary mask image, the first binary mask image comprising one or more foliage masks indicative of a presence of one or more foliage regions in the FOV with a first accuracy level. It is known that thresholding allows to separate regions of interest in an image based on pixel intensity values. The control circuitry 106 is configured to determine the threshold value on-the-fly by examining a distribution of pixel values to find a cutoff point that effectively separates foliage pixels from non-foliage pixels. The determined threshold value is applied to the normalized image to create the first binary mask image, where pixels with values above the threshold are set to 1 (white), indicating potential foliage regions, while those below the threshold are set to 0 (black). The resulting binary mask image contains one or more foliage masks, which highlight the areas identified as foliage with a certain accuracy level, such as the first accuracy level (say 70-85%). The determination of the threshold value using the histogram as an input, is shown and described in detail, for example, in FIG. 9. Thereafter, the determined threshold value is used to generate the first binary mask image (or a thresholded mask, as shown, for example, at operation 638 of FIG. 6). The first binary mask image includes the one or more foliage masks, which are indicative of the presence of one or more foliage regions in the FOV with the first accuracy level.

The control circuitry 106 is further configured to apply one or more morphology operations to remove noise in the first binary mask image and identify one or more image regions that meet a defined criteria to be considered as the foliage. The one or more morphology operations are image operations that focus on a structure and a shape of objects, for example, in binary images, such as the first binary mask image. Generally, the morphology closing is useful for smoothing object boundaries, closing small gaps between objects and making the objects in the image more compact and regular. The application of the one or more morphology operations on the first binary mask image leads to removal of the noise and more accurate identification of the one or more image regions which meet the defined criteria to be considered as the foliage. For example, morphology mask closing may be applied which involves dilation followed by erosion used to fill small holes or gaps in foliage regions. The dilation step expands the identified foliage regions in the mask, potentially filling in small gaps or indentations along their edges. The subsequent erosion step then retracts the expanded regions slightly, but primarily focusing on preserving the now-smoothed boundaries. This helps to eliminate jagged edges and create a more consistent and accurate representation of the foliage shapes. In an example, a custom structuring element may be created representative of a foliage to match specific foliage characteristics, such as a shape representing of a crown of plant (or a specific crop plant depending on agricultural field) or a cluster of leaves. Such custom structuring element may be a group of pixels in the defined shape or structure that may be used to scan the first binary mask image to remove noise to obtain a cleaner and more accurate representation of the foliage regions.

In accordance with an embodiment, the control circuitry 106 is further configured to determine a first effective region for the first difference between the green channel and the red channel intensities, the first effective region is indicative of areas in the smoothened input color image where red color is more prominent compared to rest of the smoothened input color image. The control circuitry 106 is configured to use the first difference (i.e., G−R) between the green channel intensity and the red channel intensity in determination of the first effective region. In an implementation, the first effective region may correspond to an effective R region, where red color is more prominent compared to rest of the smoothened input color image.

In accordance with an embodiment, the control circuitry 106 is further configured to determine a second effective region for the second difference between the green channel and the blue channel intensities, the second effective region is indicative of areas in the smoothened input color image where blue color is more prominent compared to rest of the smoothened input color image. The control circuitry 106 is configured to use the second difference (i.e., G−B) between the green channel intensity and the blue channel intensity in determination of the second effective region. In an implementation, the second effective region may correspond to an effective B region, where blue color is more prominent compared to rest of the smoothened input color image.

In accordance with an embodiment, the control circuitry 106 is further configured to utilize a combination of the first effective region, the second effective region, and the L-component representing lightness of the LAB color space in the identification of the one or more image regions that meet the defined criteria to be considered as the foliage. In an implementation, the control circuitry 106 may be configured to use the combination of the first effective region (i.e., the effective R region), the second effective region (i.e., the effective B region) and the L-component (e.g., L<230) in the identification of the one or more image regions that meet the defined criteria to be considered as the foliage. The control circuitry 106 merges the effective R region, the effective B region, and the L-component (with a threshold of L<230) to identify foliage regions more accurately. The use of an L-component threshold (L<230) helps to exclude very bright areas that are unlikely to be foliage, as foliage typically has a lower lightness value than bright highlights or reflective surfaces (e.g., water on ground). This combination of criteria helps to distinguish foliage from non-foliage areas more effectively, potentially reducing false positives and improving segmentation accuracy.

In accordance with an embodiment, the control circuitry 106 is further configured to feed a hue component of a third color space of the plurality of color spaces for the smoothened input color image along with the combination of the first effective region, the second effective region, and the L-component representing lightness of the LAB color space for the identification of the one or more image regions that meet the defined criteria to be considered as the foliage. In an implementation, the control circuitry 106 may be configured to use the hue component (e.g., H>20) along with the combination of the first effective region (i.e., the effective R region), the second effective region (i.e., the effective B region), and the L-component (e.g., L<230) for the identification of the one or more image regions that meet the defined criteria to be considered as the foliage. The hue component (H) represents a pure color of a pixel, often measured on a circular scale of 0 to 360 degrees, where 0 is red, 120 is green, and 240 is blue. The thresholding of H>20 excludes pixels with hue values below 20, filtering out reddish colors (like reddish brown or reddish hues which are more representative of soil) that are less characteristic of foliage. The expected hue range for foliage may be likely within the yellowish-green to bluish-green range (approximately 40-180 degrees). Thus, the effective R region, effective B region, L-component (L<230), and hue component (H>20) are all used together to identify foliage regions more accurately.

The control circuitry 106 is further configured to generate an output binary mask image of foliage mask based on the applied one or more morphology operations and the identified one or more image regions, wherein the output binary mask image of foliage mask is indicative of the presence of one or more foliage regions in the FOV with a second accuracy level greater than the first accuracy level. The application of the one or more morphology operations and the identification of the one or more image regions which meet the defined criteria to be considered as the foliage, lead to generation of the output binary mask image of foliage mask with enhanced accuracy. The output binary mask image of foliage mask is based on the refined identification of foliage regions achieved through morphology operations and the combined use of R region, B region, L-component, and hue component, leading to a more accurate mask. The output binary mask image of foliage mask represents one or more foliage regions as white pixels and non-foliage regions as black pixels, creating a clear visual representation of foliage distribution. The second accuracy level (i.e., >95% accurate in both precision and recall) may be higher than the first accuracy level (i.e., 70-85% accurate in both precision and recall). In an example, the accuracy level may be measured by using one or more metrics, such as precision indicative of a ratio of correctly identified foliage pixels to all pixels identified as foliage in the output binary mask image of foliage mask, recall indicative of a ratio of correctly identified foliage pixels to all actual foliage pixels, and/or a F1-score which combines precision and recall into a single metric. It is called a low precision when many pixels labelled as foliage in the mask are actually not foliage (false positives) and a high precision when high proportion of the pixels labelled as foliage in the mask are truly foliage. It is called low recall when many actual foliage pixels are missing from the mask (false negatives) and high recall when the mask identifies most of the actual foliage pixels in the image. Thus, the second accuracy level may indicate higher recall and higher precision as compared to the first accuracy level. More weightages may be given to recall then precision so as not to miss any foliage pixels in the mask.

In accordance with an embodiment, the control circuitry 106 is further configured to generate an optimized binary image of foliage mask by applying an image filter on the output binary mask image of foliage mask to remove isolated regions and noise, wherein the optimized binary image of foliage mask is indicative of the presence of one or more foliage regions in the FOV with a third accuracy level (i.e., 96-99.9% accurate in both precision and recall) greater than the first accuracy level and the second accuracy level. The control circuitry 106 is configured to apply the image filter (e.g., a minimum region filter) on the output binary mask image of foliage mask for removing small-small regions, which are isolated and related to the noise and generate the optimized binary image of foliage mask. Isolates regions (small groups of white pixels) and noise (random white pixels) that fall below the size threshold are removed, resulting in a cleaner and more refined mask. The specific size threshold used for the minimum region filter depends on the expected size of actual foliage regions in the images and the level of noise present. By virtue of removal of the noise and isolated regions, the optimized binary image of foliage mask is more accurate (with the third accuracy level) than the output binary mask image of foliage mask (with the second accuracy level).

In accordance with an embodiment, the control circuitry 106 is further configured to generate a set of binary images of foliage masks for a first set of input color images of different FOVs of the agricultural field, and wherein each binary image comprises one or more foliage regions demarcated from a background non-foliage region. Like the input color image captured by the image sensor 110, a number of input color images may be captured, referred to as the first set of input color images of different FOVs of the agricultural field as the camera apparatus 102 when mounted on a vehicle moves on the agricultural field. Similar to the processing of the input color image captured by the image sensor 110 to generate the optimized binary image of foliage mask, the set of binary images of foliage masks may be generate for the first set of input color images. The first set of input color images may include thousands of different images (e.g., images of a cotton plants or other crop plants) captured in different environmental conditions. The control circuitry 106 is further configured to generate the set of binary images of foliage masks for the first set of input color images. The generated set of binary images of foliage masks may also be referred to as a set of black and white images, where white regions represent the one or more foliage regions and black regions represent the non-foliage region.

Figure 1B:
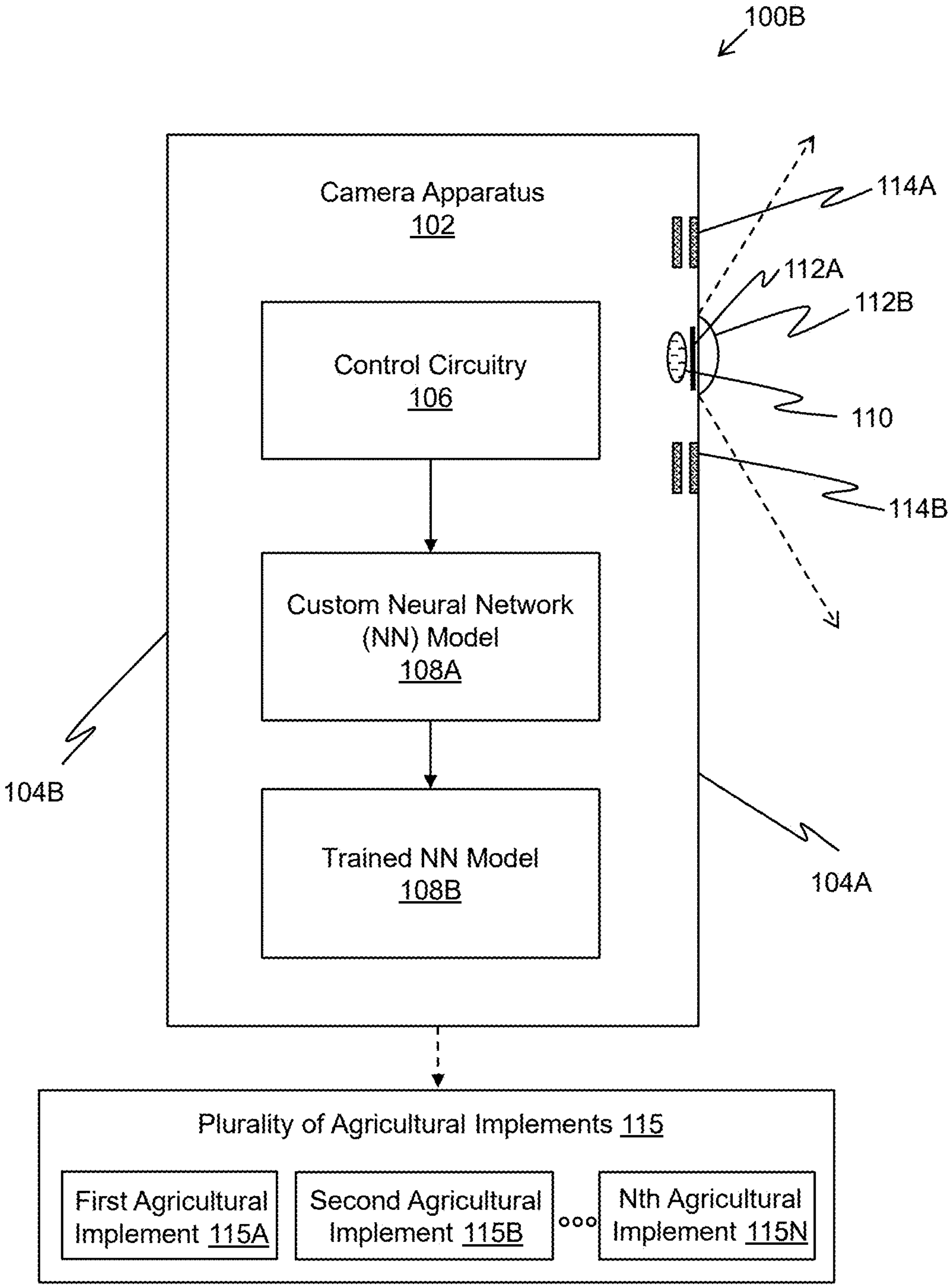
FIG. 1B is a diagram illustrating various exemplary components of a camera apparatus, in accordance with another embodiment of the present disclosure.

FIG. 1B is a diagram illustrating various exemplary components of a camera apparatus, in accordance with another embodiment of the present disclosure. With reference to FIG. 1B, there is shown a diagram 100B of the camera apparatus 102. The camera apparatus 102 may include a custom Neural Network (NN) model 108A and a trained custom NN model 108B, in addition to the components shown and described, for example, in the FIG. 1A. Furthermore, the control circuitry 106 may be configured to operate at least one of a plurality of agricultural implements 115, such as a first agricultural implement 115A, based on at least the generated output binary mask image of foliage mask. The plurality of agricultural implements 115 may include N agricultural implements, such as the first agricultural implement 115A, a second agricultural implement 115B, up to a Nth agricultural implement 115N.

The custom NN model 108A may be a deep neural network (DNN) model, such as convolution neural network (CNN) model, which is customized and re-configured in a two-branch architecture or a three-branch architecture for execution of a training phase for foliage detection. An example of the three-branch architecture is shown and described, for example, in FIG. 4. An example of the two-branch architecture is shown and described, for example, in FIG. 5. The custom NN model 108A is subjected to a training phase, where the custom NN model 108A is configured to learn not only a plurality of features related to foliage but also a color variation range of a predefined color (e.g., different shades of green color) associated with the plurality of features, which significantly enhances the training performance to detect the foliage with improved accuracy and reliability.

Typically, an off-the-shelf or conventional CNN models operate by learning features from images and then predicting similar features when a new image is captured in an operational phase. In contrast to the conventional systems, the CNN model is custom configured and specially designed for training for a specific purpose of foliage detection in agricultural environment. For instance, a conventional CNN model is custom configured to obtain the custom NN model 108A by branching the convolution neural network model into a plurality of different types of training branches, where a first type of training branch of the plurality of different types of training branches is configured for the learning of the plurality of features related to foliage from the modified training dataset, and where a second type of training branch of the plurality of different types of training branches is configured for the learning of the color variation range of the predefined color associated with the plurality of features.

The trained custom NN model 108B is a trained version of the custom NN model 108A and subjected to an operational phase. Alternatively stated, the trained custom NN model 108B is configured to detect one or more foliage regions in an input color image captured by the camera apparatus 102 in a real time or near real time in the agricultural filed or a different agricultural field.

In an implementation, the training of the custom NN model 108A may be performed in the camera apparatus 102. Alternatively stated, the control circuitry 106 is configured to execute the training phase of the custom NN model 108A in the camera apparatus 102. In another implementation scenario, the training of the custom NN model 108A may be performed outside the camera apparatus 102, for example, a computing device or at a training server, described in detail, for example, in FIG. 1C, and then the trained custom NN model 108B may be deployed in the camera apparatus 102 for the operational phase.

Examples of implementation of the first agricultural implement 115A may include, but is not limited to, a sprayer comprising a plurality of electronically controllable spray nozzles and a cutter comprising a plurality of electronically controllable cutting blades (e.g., for lettuce thinning). Examples of implementation of the second agricultural implement 115B may include, but is not limited to, a precision spot sprayer comprising a plurality of electronically controllable spray nozzles for spraying weedicide on the one or more weed regions in the agricultural field and a cutter comprising a plurality of electronically controllable cutting blades (e.g., for uprooting weeds), a laser-based device to emit laser beams on the one or more weed regions, or other means of killing, uprooting, pruning, or dislocating weeds, described in detail, for example, in FIGS. 13A to 13F.

Figure 1C:
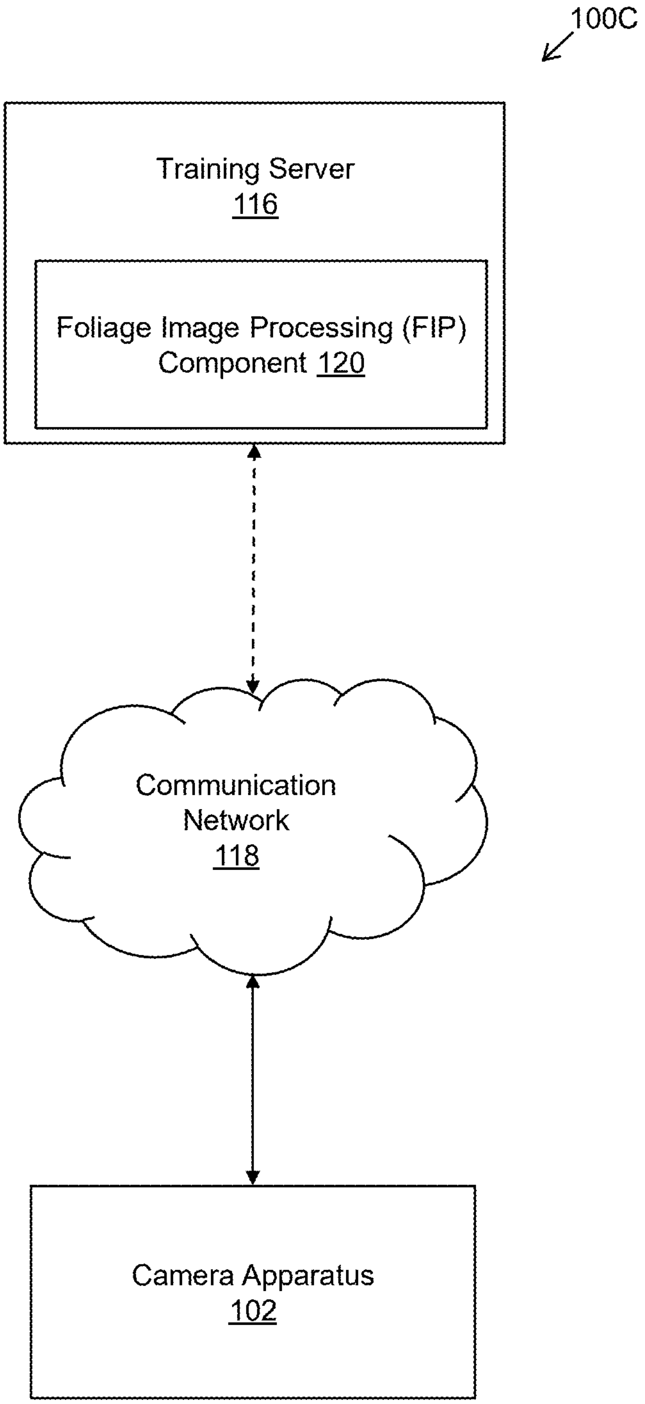
FIG. 1C is a network environment diagram of a camera apparatus, in accordance with an embodiment of the present disclosure.

FIG. 1C is a network environment diagram of a camera apparatus, in accordance with an embodiment of the present disclosure. FIG. 1C is described in conjunction with elements from FIGS. 1A and 1B. With reference to FIG. 1C, there is shown a network environment diagram 100C that comprises the camera apparatus 102 (of FIG. 1A), a training server 116, and a communication network 118. There is further shown a foliage image processing (FIP) component 120 in the training server 116. In some implementations, the FIP component 120 may be a part of the camera apparatus 102.

In this embodiment, the training of the custom NN model 108A may be performed in the training server 116. Due to execution of the training phase in the training server 116, the FIP component 120 may be provided in the training server 116. The FIP component 120 is configured to generate masks for one or more foliage regions (e.g., binary images of foliage mask) present in the input color image (i.e., the foliage image) captured by the camera apparatus 102.

Examples of the training server 116 may include, but are not limited to, a cloud server, an application server, a storage server, or a combination thereof. Moreover, the training server 116 may either be a single hardware server or a plurality of hardware servers operating in a parallel or distributed architecture to execute the training phase of the custom NN model 108A.

The communication network 118 may include suitable logic, circuitry, interfaces and/or code that is configured to connect the camera apparatus 102 to the training server 116. Examples of the communication network 118 may include, but are not limited to, a cellular network (e.g., a 5G, or 5G NR network, such as sub 6 GHZ, cmWave, or mmWave communication network), a wireless sensor network (WSN), a cloud network, a Local Area Network (LAN), a vehicle-to-network (V2N) network, a Metropolitan Area Network (MAN), and/or Internet.

Figure 2A:
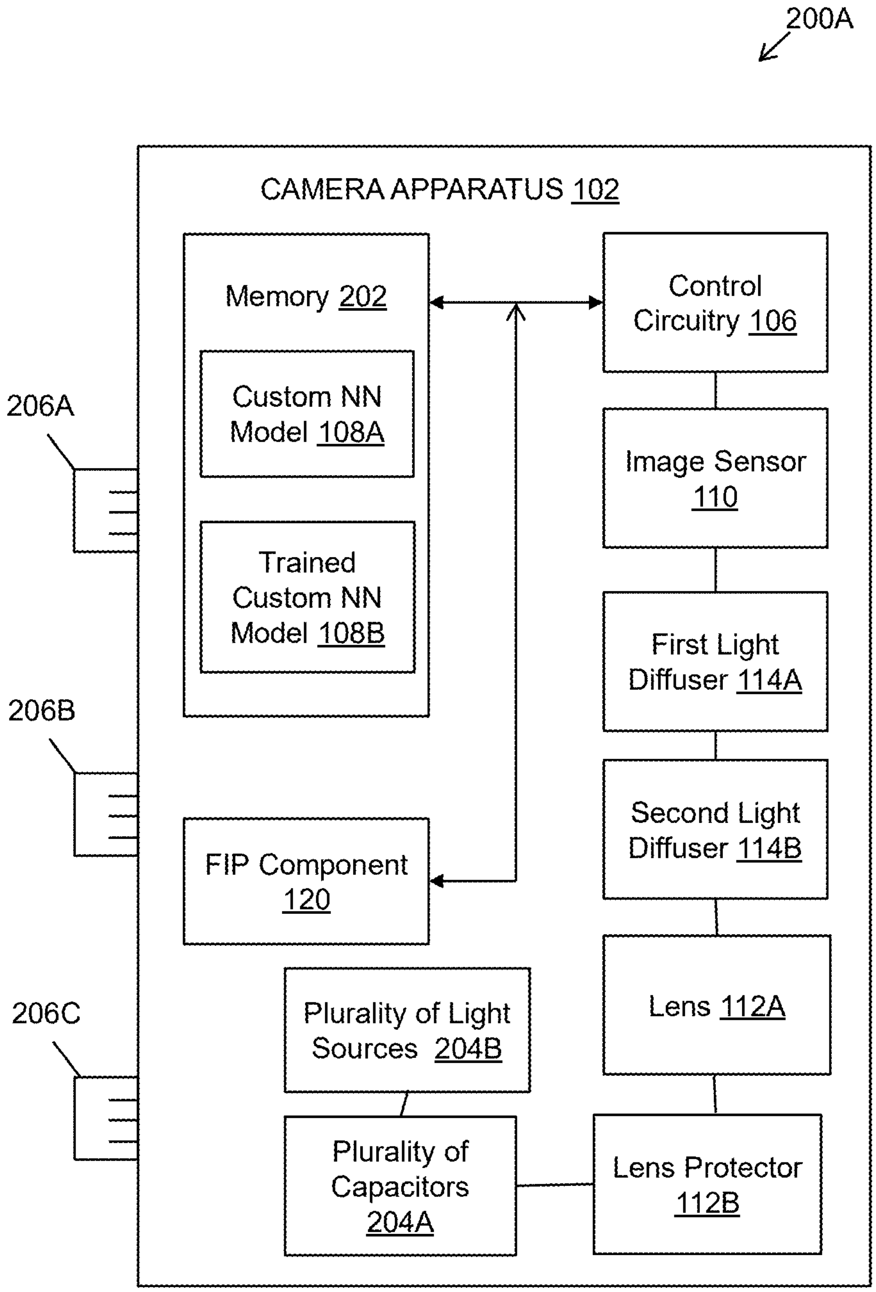
FIG. 2A is a block diagram illustrating various exemplary components of a camera apparatus, in accordance with another embodiment of the present disclosure.

FIG. 2A is a block diagram illustrating various exemplary components of a camera apparatus, in accordance with another embodiment of the present disclosure. FIG. 2A is described in conjunction with elements from FIGS. 1A, 1B and 1C. With reference to FIG. 2A, there is shown a block diagram 200A of the camera apparatus 102 (of FIG. 1A). The camera apparatus 102 may further include a memory 202, a plurality of capacitors 204A, a plurality of light sources 204B, and a plurality of connectors, such as a first connector 206A, a second connector 206B and a third connector 2060 in addition to the components shown and described, for example, in the FIG. 1A.

The memory 202 may include suitable logic, circuitry, interfaces and/or code that is configured to store machine code and/or instructions executable by the control circuitry 106. Examples of implementation of the memory 202 may include, but are not limited to, a Solid-State Drive (SSD), an Electrically Erasable Programmable Read-Only Memory (EEPROM), Random Access Memory (RAM), Read Only Memory (ROM), Hard Disk Drive (HDD), Flash memory, a Secure Digital (SD) card, a computer readable storage medium, and/or CPU cache memory. The memory 202 is configured to store the custom NN model 108A and the trained custom NN model 108B. The memory 202 may store an operating system and/or a computer program product to operate the camera apparatus 102. A computer readable storage medium for providing a non-transient memory may include, but is not limited to, an electronic storage device, a magnetic storage device, an optical storage device, an electromagnetic storage device, a semiconductor storage device, or any suitable combination of the foregoing. In FIG. 2A, the custom NN model 108A and the trained custom NN model 108B are stored in the memory 202. In another implementation, the custom NN model 108A may not be stored and the trained custom NN model 108B may be stored in the memory 202.

Each of the plurality of capacitors 204A may be used to supply consistent power to the plurality of light sources 204B (such as LED or strobe lights) to generate high intensity light flashes for very short duration in sync with operation of the image sensor 110 of the camera apparatus 102 to capture a first set of input color images of the agricultural field.

In an implementation, the first connector 206A may be used as a power supply port to power the camera apparatus 102. The second connector 206B is configured to connect to one or more agricultural implements, such as a chemical sprayer or a mechanical implement to actuate cutting blades, to actuate the one or more agricultural implements, devices, or tools. In an implementation, the second connector 206B may include multiple pins that can handle multiple actuation units, concurrently. For example, the camera apparatus 102 may include an integrated PCB that includes a plurality of actuators (e.g., 6-20 actuator chips) that may handle a plurality of electronically controllable spray valves in a sprayer. The third connector 206C is configured to establish a network with other camera apparatuses or other devices (e.g., a display apparatus) mounted in an agricultural vehicle or machine. In an example, the network may be a local area network (LAN) connection.

Figure 2B:
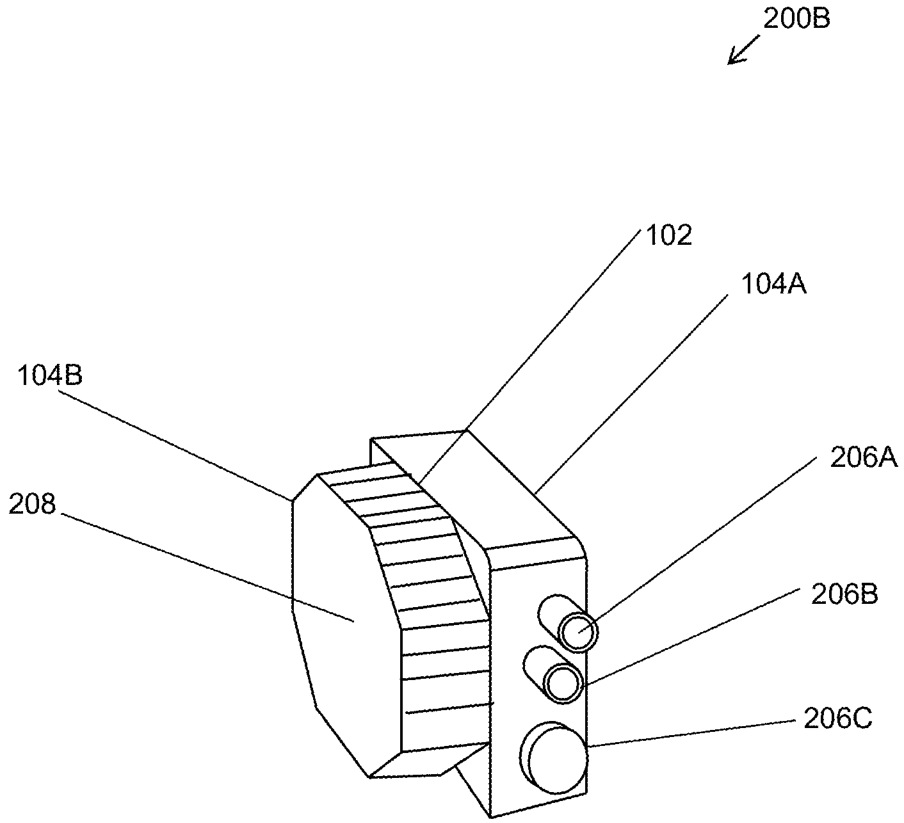
FIG. 2B is a diagram illustrating perspective rear view of a camera apparatus, in accordance with an embodiment of the present disclosure.

FIG. 2B is diagram illustrating a perspective rear view of a camera apparatus, in accordance with an embodiment of the present disclosure. FIG. 2B is described in conjunction with elements from FIGS. 1A-1C, and 2A. With reference to FIG. 2B, there is shown a perspective rear view 200B of the camera apparatus 102.

The perspective rear view 200B of the camera apparatus 102 shows the rear side 104B of the camera apparatus 102, and each of the plurality of connectors, such as the first connector 206A, the second connector 206B and the third connector 206C. The plurality of connectors may be provided at the lateral side of the camera apparatus 102. The rear side 104B of the camera apparatus 102 comprises a passive heat sink 208. The passive heat sink 208 is used to dissipate the heat generated by one or more processors, such as the control circuitry 106 of the camera apparatus 102.

Figure 2C:
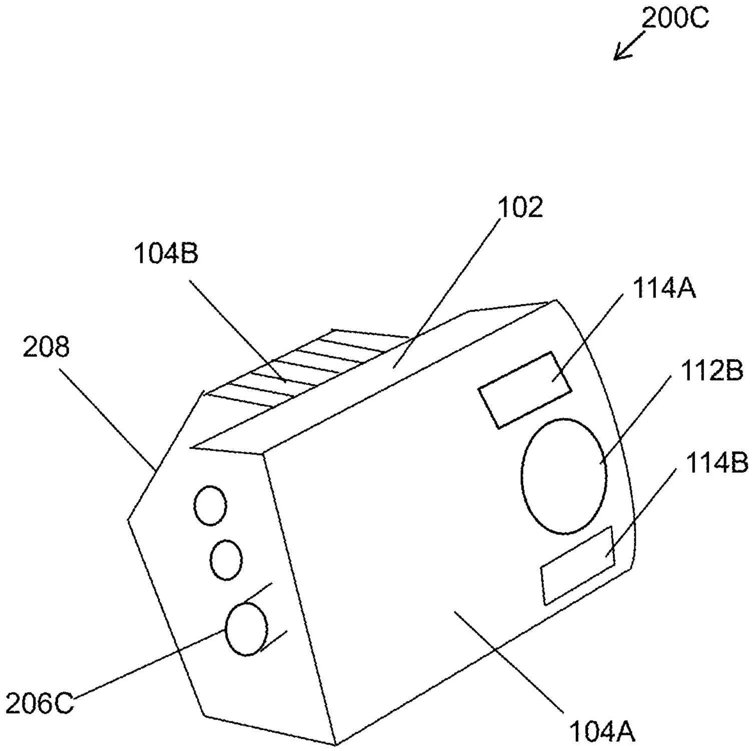
FIG. 2C is a diagram illustrating perspective front view of a camera apparatus, in accordance with an embodiment of the present disclosure.

FIG. 2C is diagram illustrating a perspective front view of a camera apparatus, in accordance with an embodiment of the present disclosure. FIG. 2C is described in conjunction with elements from FIGS. 1A-1C, 2A, and 2B. With reference to FIG. 2C, there is shown a perspective front view 200C of the camera apparatus 102.

The perspective front view 200C of the camera apparatus 102 shows the front side 104A of the camera apparatus 102. The front side 104A of the camera apparatus 102 comprises the image sensor 110, the lens protector 112B, and the plurality of light diffusers, such as the first light diffuser 114A and the second light diffuser 114B. A plurality of light sources (not shown) is disposed around the image sensor 110 at two or more concentrated regions behind the first light diffuser 114A and the second light diffuser 114B.

Figure 2D:
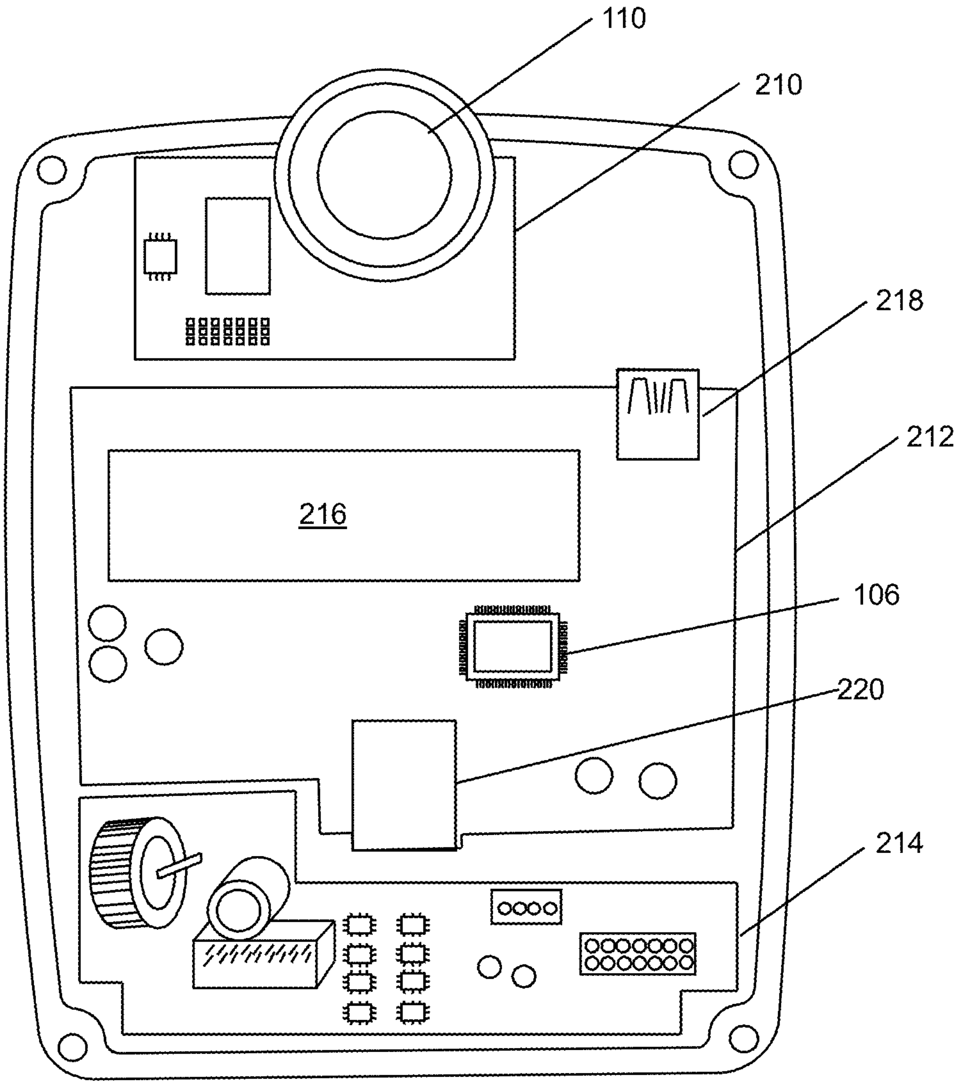
FIG. 2D is a diagram illustrating internal components of a camera apparatus, in accordance with an embodiment of the present disclosure.

FIG. 2D is a diagram illustrating various internal components of a camera apparatus, in accordance with an embodiment of the present disclosure. FIG. 2D is described in conjunction with elements from FIGS. 1A-1C, 2A, 2B, and 2C. With reference to FIG. 2D, there are shown a first printed circuit board (PCB) 210, a second PCB 212 and a third PCB 214. The first PCB 210 is configured as an image sensing and light control board, the second PCB 212 is configured as a custom designed motherboard and the third PCB 214 is configured as a power supply board. The first PCB 210 comprises the image sensor 110. The plurality of light sources 204B (not shown here) may be strobe LED PCBs (e.g., different PCBs) arranged on different regions (e.g., either sides) of the first PCB 210 serving as strobe light with LED and capacitors, such as the plurality of capacitors 204A. In an example, the plurality of light sources 204B may be disposed around the image sensor 110 at two or more concentrated regions and powered by the plurality of capacitors 204A. The second PCB 212 comprises a storage device 216 (e.g., a solid-state drive (SSD)), a universal serial bus (USB) port 218 and an ethernet module 220. The control circuitry 106 is integrated to the second PCB 212. The third PCB 214 is configured to power the components of the first PCB 210 and the second PCB 212. The third PCB 214 comprises a number of actuators (e.g., actuator chips) and DC-to-DC converters.

Figure 3A:
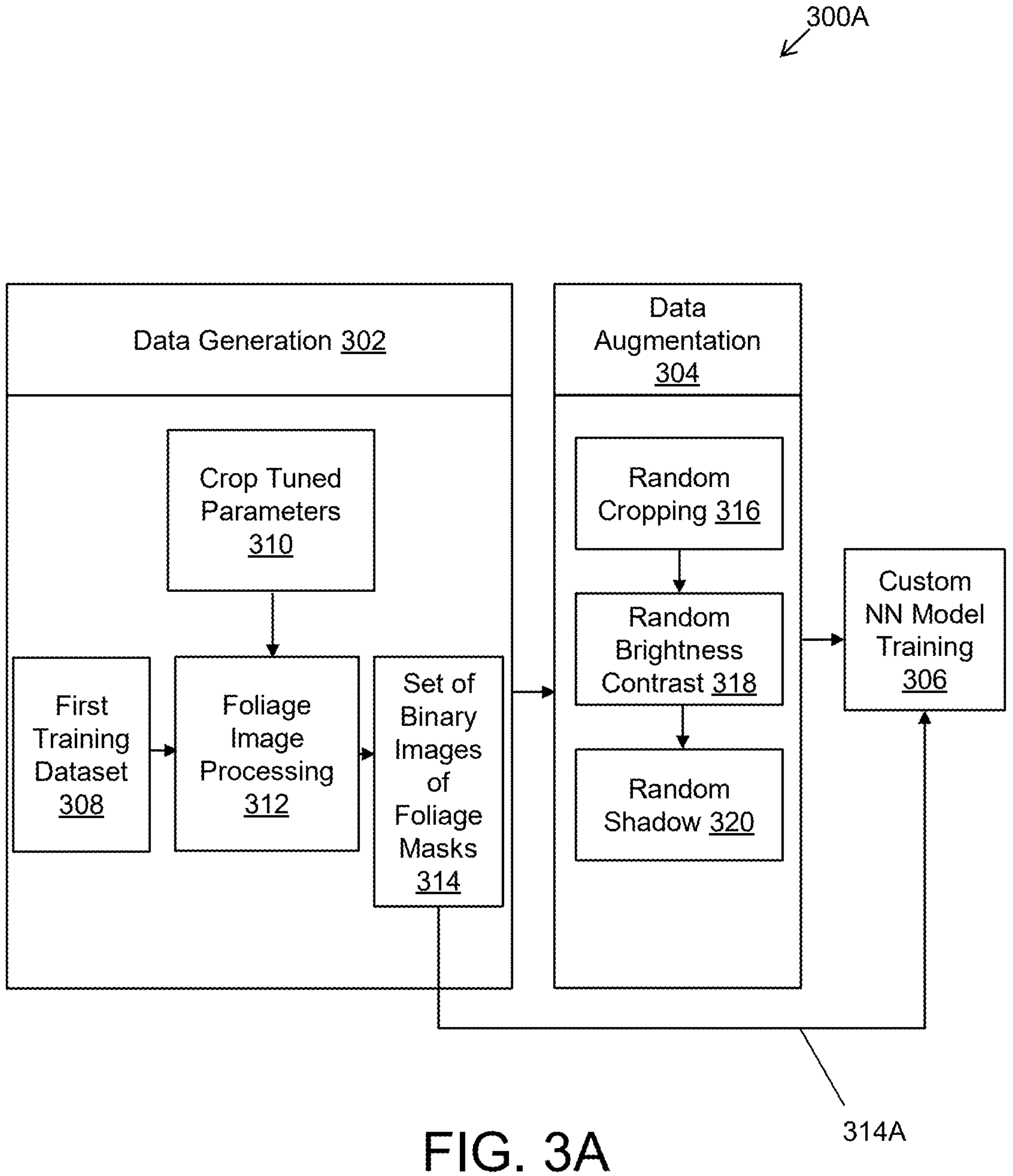
FIG. 3A is a diagram illustrating a training phase of a custom neural network (NN) model comprised by a camera apparatus, in accordance with an embodiment of the present disclosure.

FIG. 3A is a diagram illustrating a training phase of a custom neural network (NN) model, in accordance with an embodiment of the present disclosure. FIG. 3A is described in conjunction with elements from FIGS. 1A-1C, and 2A-2D. With reference to FIG. 3A, there is shown a training phase 300A of the custom NN model 108A.

As shown in FIG. 3A, the training phase 300A of the custom NN model 108A may be segregated into three sub-phases or processes, such as a first sub-phase or process of data generation 302, a second sub-phase or process of data augmentation 304 and a third sub-phase or process of custom NN model training 306. The third sub-phase or process of custom NN model training 306 involves training of the custom NN model 108A (of FIG. 1A). The sub-phase or process of data generation 302 includes a series of operations 308 to 312. The second sub-phase or process of data augmentation 304 includes a series of operations 316 to 320.

At operation 308, a first training dataset comprising a first set of input color images of an agricultural field or another agricultural field is acquired. In other words, the control circuitry 106, in the training phase, may be configured to acquire the first training dataset comprising the first set of input color images of the agricultural field or the other agricultural field. The camera apparatus 102 may be configured to capture a first set of input color images of one or more agricultural fields. For example, agricultural fields of crop plants like chili, brinjal, lettuce, potato, tomato, cabbage, cauliflower, carrot, radish, cotton, and the like may be captured. Such agricultural fields may also include different varieties of weeds along with crop plants. In the training phase, thousands of different images (e.g., images of a cotton plants or other crop plants) may be captured in different locations, different positions (e.g., towards the sun), at different time of day (e.g., early morning, evening or night), and at different growth stages (e.g., two-day cotton plant, three-day cotton plant), or different heath state may be used. Various soil types like brown soil, greenish soil, black soil, cracks on soil, i.e., different texture and color of soil may be included in the first training dataset. A FOV of approximately 2 meters may be used to capture the first set of input color images of one or more agricultural fields.

At operation 310, a plurality of crop tuned parameters, such as color gradients (e.g., red color gradient, blue color gradient), color tolerances (e.g., red color tolerance, blue color tolerance), and the like, are considered, in order to determine the color variation range of foliage, such as the yellowish green color, bluish green color, reddish green color variations in foliage, and the like.

At operation 312, the foliage image processing is executed on the acquired first training dataset. The crop tuned parameters may be used in the foliage image processing by the FIP component 120. The control circuitry 106 may be configured to execute the FIP component 120 (e.g., one or more modified computer vision (cv) based green-on-brown image processing algorithms) to generate a set of binary images of foliage masks 314.

Alternatively stated, the control circuitry 106 is configured to generate the set of binary images of foliage masks 314, where each binary image comprises one or more foliage regions demarcated from a background non-foliage region. Generally, the foliage detection is advanced form of conventional Green-on-Brown (GoB) detection, as not only the leaves or stem of a tree or plant having either green color is considered but also different shades of green color, for example, yellowish green color, bluish green color, reddish green color, and the like, grown in soil having different color (e.g., brown, light brown, dark brown, greenish brown etc.), can be accurately identified. The foliage includes crop plants as well as weed plants. The binary images of foliage masks may also be referred to as black and white images, where white regions represent the one or more foliage regions and black regions represent the non-foliage region. An exemplary scenario of a binary image with foliage masks is shown and described in detail, for example, in FIG. 10.

In accordance with an embodiment, in order to generate the set of binary images of the foliage masks, the control circuitry 106, in the training phase, is further configured to smoothen an input color image of the agricultural filed with a median blur, convert the smoothened input color image into a plurality of different color spaces and execute a set of channel operations on an individual channel or combined channels in each color space of the plurality of different color spaces to enhance green pixels and suppress other pixels, where the green pixels are indicative of foliage. The control circuitry 106 is configured to smoothen the input color image, where smoothening means to eliminate the illumination difference from the input color image and generate the smoothened input color image, which has even brightness. Thereafter, the smoothened color input image is converted to the plurality of different color spaces, such as RGB color space or LAB color space, described in detail, for example, in FIGS. 6 and 7. The control circuitry 106 is further configured to execute the set of channel operations either on the individual channel or the combined channels in each color space in order to enhance the green pixels (or green color) and suppress the other color pixels, described in detail, for example, in FIGS. 6 and 7.

In accordance with an embodiment, in order to generate the set of binary images of the foliage masks, the control circuitry 106, in the training phase, is further configured to generate a normalized image with the enhanced green pixels based on outputs received from each color space processing path associated with the plurality of different color spaces. The outputs from each color space (i.e., RGB or LAB color space) is further processed and normalized to obtain the normalized image, which has enhanced green pixels, described in detail, for example, in FIGS. 6 and 7.

In accordance with an embodiment, in order to generate the set of binary images of the foliage masks, the control circuitry 106, in the training phase, is further configured to determine a threshold value based on a histogram of the normalized image and apply the determined threshold value to generate a first binary mask image. The control circuitry 106 is further configured to compute the histogram of the normalized image and then, compute the threshold value using the histogram of the normalized image. The computation of the threshold value is described in detail, for example, in FIG. 9. The control circuitry 106 is further configured to apply the threshold value in order to generate the first binary mask image, which may also be referred to as a thresholded mask.

In accordance with an embodiment, in order to generate the set of binary images of the foliage masks, the control circuitry 106, in the training phase, is further configured to apply one or more morphology operations to remove noise in the first binary mask image, identify image regions that meet a defined criteria to be considered as foliage and generate an output binary mask image based on the applied one or more morphology operations and the identified image regions. The control circuitry 106 is further configured to apply the one or more morphology operations, such as morphological closing, in order to remove noise from the first binary mask image. Generally, the morphological closing is useful for filing small holes in the first binary mask image while preserving the shape and size of objects within the first binary mask image. The control circuitry 106 is further configured to identify the image regions which are considered as the foliage based on the defined criteria and generate the output binary mask image, described in detail, for example, in FIGS. 6 and 7.

In accordance with an embodiment, in order to generate the set of binary images of the foliage masks, the control circuitry 106, in the training phase, is further configured to generate an optimized binary image of foliage mask by applying filter on the output binary mask image to remove isolated regions and noise, where the set of binary images of the foliage masks comprises a number of optimized binary images of the foliage masks. The control circuitry 106 is further configured to apply the filter on the output binary mask image in order to remove the isolated regions (or small regions with noise) and noise and generate the optimized binary image of foliage mask. Two different implementation examples of the generation of the set of binary images of foliage masks 314 are described in detail, for example, in FIGS. 6 and 7.

At 314A, the set of binary images with foliage masks 314 may be used as the ground truth (i.e., the reference set) during training of the custom NN model 108A. Therefore, the generated set of binary images with foliage masks 314 is also used as an input along with input color images for training of the custom NN model 108A performed in third-phase of the custom NN model training 306. Thus, the first sub-phase or process of data generation 302 involves generation of the first training dataset and the generation of the set of binary images with foliage masks 314.

After the first sub-phase or process of data generation 302, the second sub-phase or process of data augmentation 304 is executed. At operation 316, the plurality of image augmentation (or data augmentation) operations, such as random cropping, is applied on the first set of input color images of the first training dataset. In the random cropping, pixels (in a specific range) are randomly cropped from the first set of input color images in order to generate modified color images. The control circuitry 106 may be configured to generate a second set of color images greater in number than the first set of input color images by applying a plurality of image augmentation operations on the first set of input color images, where the modified training dataset comprises the first set of input color images and the generated second set of color images. In the training phase, the control circuitry 106 is configured to acquire the first training dataset comprising the first set of input color images of the agricultural field or the other agricultural field. The other agricultural field is considered to extend the range of foliage, which means to extend the varieties of crop plants as well as weed plants growing in different kind of agricultural fields, leading to a more advanced training of the custom NN model 108A. Furthermore, the control circuitry 106 is further configured to generate the second set of color images by applying the plurality of image augmentation operations, such as random cropping, random brightness contrast, random shadow, and the like, on the first set of input color images. The second set of color images is larger than the first set of input color images, for example, the second set of color images may have 60000 color images whereas, the first set of input color images may have 10000 color images, only.

At operation 318, an image augmentation operation of random brightness contrast is applied on the first set of input color images. In the random brightness contrast, an illumination difference is created in each of the first set of input color images. At operation 320, an image augmentation operation of random shadow is applied on the first set of input color images. In the random shadow operation, a random shadow on foliage is created in each of the first set of input color images. The operations 316, 318 and 320 of the data augmentation 304 are executed to generate the second set of input color images which is larger than the first set of input color images. Alternatively stated, the second sub-phase or process of data augmentation 304 is executed in order to generate the modified training dataset which comprises the first set of input color images as well as the generated second set of color images. In other words, the control circuitry 106 is configured to generate a modified training dataset of color images from the first set of input color images and train the custom NN model 108A for foliage detection based on the generated set of binary images of foliage masks and the modified training dataset. The control circuitry 106 is configured to generate the modified training dataset of color images by applying various image augmentation operations, such as random cropping, random brightness contrast, and random shadow, and the like, on the first set of input color images.

For the random cropping 316, consider an original color image of size 100×100 pixels, depicting a scene like an agricultural field. This image has various elements like plants, soil, and possibly some environmental features. The random cropping may begin by generating random numbers to define the area of the image that will be cropped. In an example, 20 to 70 or 30 to 80 pixels areas may be cropped. These numbers represent the coordinates on the image from which the crop will start and end. Based on the random numbers generated, a portion of the original color image may be selected for cropping. For instance, if the numbers generated are 20 and 70, the cropped section would be the area of the image that lies within these coordinates. This cropped section effectively becomes a new, smaller image, extracted from the original color image. The primary goal of random cropping is to introduce variation in the first training dataset. By randomly selecting different parts of the image to crop, a set of new color images may be generated, where each new color image focus on different segments of the original scene. This variation simulates the effect of zooming in on different parts of the field or viewing the field from different angles. Sometimes, random cropping may result in new color images where only part of an object (like half of a plant) is visible. This is intentional and beneficial for training purposes. It causes the custom NN model 108A to recognize objects (like plants) even when they are partially visible or obscured, which may be a common scenario in real-world conditions. Furthermore, by creating multiple cropped color images from a single original image, the amount of data available for training may be increased without the need for additional real-world data collection.

For the random brightness contrast 318, for an original input color image, say of an agricultural field with plants and foliage, there may be certain level of brightness that represents a specific time of day or lighting condition. Random brightness adjustment involves changing the brightness level of the image in a random manner by either increasing or decreasing the brightness. The degree of adjustment is typically determined randomly within a predefined range to ensure natural-looking results, i.e., to represent sunlight variation and lighting observed in an agricultural field. By adjusting the brightness, the control circuitry 106 may be configured to simulate different times of the day or varying weather conditions. A brighter image might resemble midday sunlight, while a darker image might mimic an overcast day or early morning/evening light. The process may be repeated across many images in the first training dataset including applying on the newly generated color images form the random cropping operation. Each output color image thus gets a different level of brightness adjustment, leading to a wide variety of lighting conditions being represented in the modified training dataset. In real agricultural settings, lighting conditions vary significantly throughout the day and across different weather conditions. Random brightness adjustment ensures that the custom NN model 108A is exposed to and trained on this variability, enhancing its ability to function accurately in real-world scenarios. Training on color images with varied brightness levels increases the robustness of the custom NN model 108A. It becomes more capable of correctly identifying and analyzing foliage, regardless of the lighting condition in which the real-time color images are captured. Furthermore, by introducing variations in brightness, the custom NN model 108A is less likely to overfit to specific lighting conditions. This means it will perform better when applied to new, unseen images in operational phase that might have different lighting from the modified training dataset.

For the random shadow 320, the control circuitry 106 may be configured to overlay artificial shadows onto original input color images in the first training dataset and newly created color images from the random cropping 316 and the random brightness contrast 318. The shadows may be generated randomly, both in terms of their location within the image and their size, shape, and intensity mimicking natural environment and shadow-on-plants conditions. These artificial shadows mimic the effect of natural obstacles like clouds, trees, or other plants blocking sunlight at different times of the day. By doing so, the augmented images replicate a wide range of realistic shadow conditions that might be encountered in an agricultural setting. The randomness in shadow placement and characteristics ensures that each newly created color image in the modified training dataset has a unique shadow profile. This adds variability and realism to the modified training dataset, as shadows in the real world are rarely uniform and change constantly with the position of the sun and environmental structures. The custom NN model 108A trained on such modified training datasets become more robust to variations in lighting and shadowing, which are common in outdoor agricultural environments. This is particularly useful for an agricultural environment, where consistent lighting cannot be guaranteed. By introducing a range of shadow conditions, the custom NN model 108A may be prevented from overfitting to specific lighting scenarios, ensuring it performs well in a variety of real-world conditions. This is also observed to aid in accurately identifying and assessing plant health under different natural lighting situations. This may be useful for tasks like detecting disease, assessing growth, or monitoring water stress in crops.

At the third sub-phase or process of custom NN model training 306, the control circuitry 106 is further configured to train the custom NN model 108A based on the generated set of binary images of foliage masks and the modified training dataset of color images. The custom NN model 108A is trained for foliage detection which includes detection of crop plants as well as weed plants in an agricultural field. The set of binary images with foliage masks 314 (generated in the first sub-phase or process of data generation 302 as ground truth) and the modified training dataset (generated in the second sub-phase or process of data augmentation 304) are used for training of the custom NN model 108A to obtain the trained custom NN model 108B, which is used in the operational phase, as shown in, for example, in FIG. 3B.

In the training phase, the control circuitry 106 causes the custom NN model 108A to learn a plurality of features related to foliage from the modified training dataset. The custom NN model 108A is configured to learn the plurality of features related to the foliage, such as leaf shapes, leaf sizes, leaf orientations, leaf textures and arrangement of leaves, and the like, from the modified training dataset. The plurality of features related to foliage contribute to overall appearance, health and function of the foliage. Beneficially, the control circuitry 106 further causes the custom NN model 108A to further learn a color variation range of a predefined color associated with the plurality of features. In other words, the custom NN model 108A is further configured to learn the color variation range of the predefined color, such as different color shades of the green color, for instance, yellowish green, bluish green, reddish green, and the like. The control circuitry 106 may be configured to utilize a combination of the plurality of features related to foliage and the color variation range of the predefined color to obtain the trained custom NN model 108B. In accordance with an embodiment, the predefined color is a green color, and where the color variation range of the predefined color corresponds to a plurality of different shades of the green color. The color variation range of the predefined color, which is the green color, corresponds to different shades of the green color, such as yellowish green color, bluish green color, reddish green color, and the like. Thus, the custom NN model 108A is configured to utilize the combination of the plurality of features of foliage and the different color shades of foliage to obtain the trained custom NN model 108B. The trained custom NN model 108B is used for foliage detection in real-time or near real-time. The training the custom NN model 108A on a diverse set of foliage features along with color variations significantly enhances its capability to accurately detect and analyze foliage in various conditions. This comprehensive approach to model training ensures that the trained custom NN model 108B is well-equipped for practical applications in fields that require detailed and accurate foliage analysis. By learning a wide range of features and color variations, i.e., different shades of green color of foliage, the trained custom NN model 108B is obtained which may be highly capable of accurately recognizing different types of foliage, under various conditions.

In accordance with an embodiment, the control circuitry 106, in the training phase, is further configured to utilize the generated set of binary images of foliage masks as ground truth 314A during training of the custom NN model 108A. The generated set of binary images of foliage masks 314 is used as the ground truth 314A (i.e., a reference set) during training of the custom NN model 108A. For example, for an input color image, the control circuitry 106 is configured to generate a binary image of foliage mask for the input color image. Therefore, there is a pair of the input color image and the corresponding binary image of foliage masks, which is used as the ground truth (or the reference set) for training of the custom NN model 108A. Further, if any change in any feature of the input color image is performed, the trained custom NN model 108B is able to generate the same foliage mask as generated for the input color image based on the pair of the input color image and the corresponding binary image of foliage masks.

Typically, an off-the-shelf or conventional NN models operate by learning features from images and then predicting similar features when a new image is captured in an operational phase. In contrast to the conventional systems, the custom NN model 108A is custom configured and specially designed for training for a specific purpose of foliage detection in agricultural environment. The custom NN model 108A may be a deep neural network (DNN) model, such as convolution neural network (CNN) model, which is customized and re-configured in a two-branch architecture or a three-branch architecture for execution of a training phase for foliage detection. An example of the three-branch architecture is shown and described, for example, in FIG. 4. An example of the two-branch architecture is shown and described, for example, in FIG. 5.

In accordance with an embodiment, the control circuitry 106, in the training phase, is further configured to configure a convolution NN (CNN) model to obtain the custom NN model 108A by branching the CNN model into a plurality of different types of training branches, where a first type of training branch of the plurality of different types of training branches is configured for the learning of the plurality of features related to foliage from the modified training dataset, and wherein a second type of training branch of the plurality of different types of training branches is configured for the learning of the color variation range of the predefined color associated with the plurality of features. In the training phase, the control circuitry 106 is further configured to execute branching of the CNN model into the plurality of different types of training branches. The first type of training branch is configured to learn the plurality of features related to foliage, such as leaf shapes, leaf sizes, leaf orientations, leaf textures and arrangement of leaves, and the like, from the modified training dataset. The second type of training branch is configured to learn the color variation range that means different shades of green color, for example, yellowish green color, bluish green color, reddish green color, and the like.

In accordance with an embodiment, the control circuitry 106, in the training phase, is further configured to integrate outputs from the first type of training branch and the second type of training branch and pass the integrated output to a set of final layers of the CNN model and generate an output binary mask image for a corresponding input color image of the modified training dataset, where the output binary mask image is indicative of the one or more foliage regions set in a first binary value different from a second binary value set for the background non-foliage region. The integration (or concatenation) of the outputs from the first type of training branch and the second type of training branch and generation of the output binary mask image using the integrated output is described in detail, for example, in FIG. 5. The output binary mask image represents the one or more foliage regions present in the input color image. Moreover, the one or more foliage regions have the first binary value (e.g., "1") and the non-foliage regions have the second binary value (e.g., "0") different from the first binary value.

In accordance with an embodiment, the control circuitry 106, in the training phase, is further configured to assign a different kernel value for each of the plurality of different types of training branches for the configuration of the CNN model. Each training branch from the plurality of different types of training branches has different parameters, such as kernel shape, dilations, padding, and the like. In an implementation scenario, the first type of training branch may have a kernel shape of 3 and the second type of training branch may have a kernel shape of 5. Different kernel sizes can extract different characteristics of foliage, such as a smaller kernel might pick up fine details, while a larger kernel can grasp broader features. This is particularly beneficial for complex tasks like foliage detection in agriculture, where color variations of green color and features like overall plant shape or foliage shape are useful.

Figure 3B:
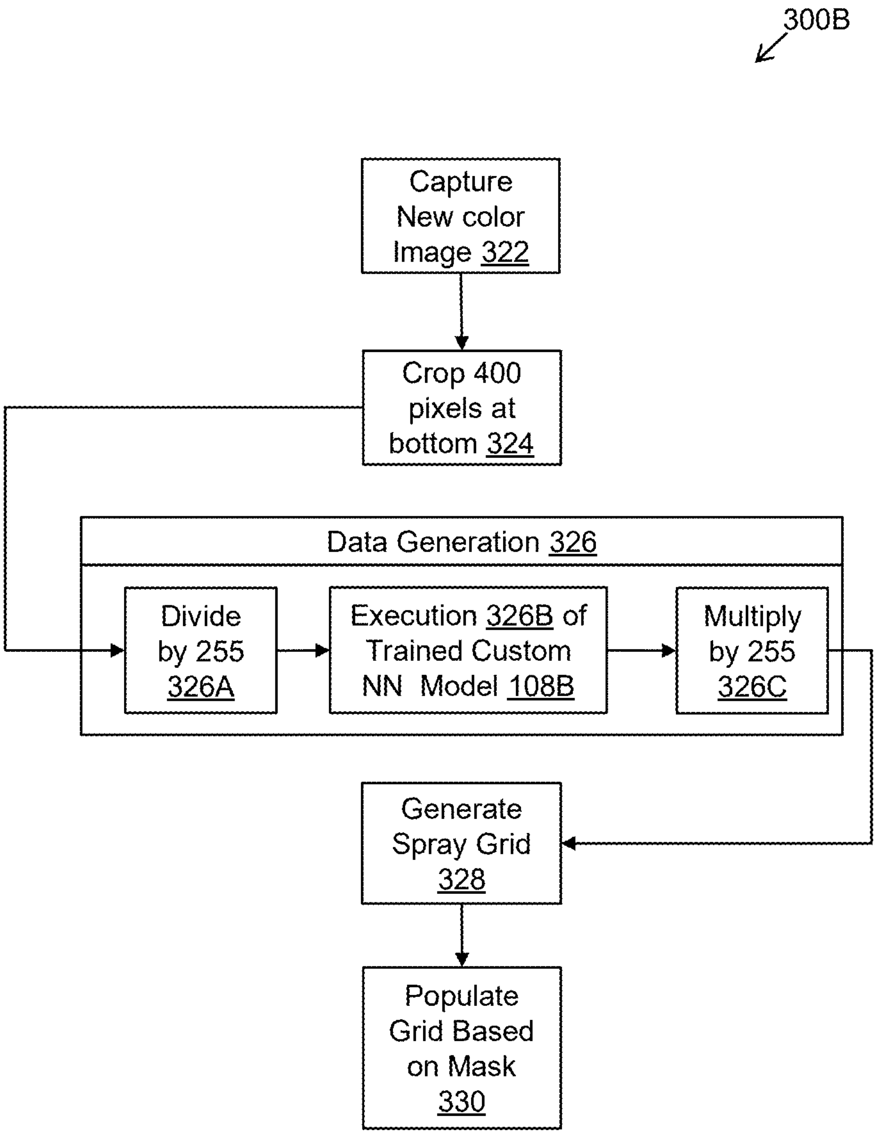
FIG. 3B is a diagram illustrating an operational phase of a trained custom NN model comprised by a camera apparatus, in accordance with an embodiment of the present disclosure.

FIG. 3B is a diagram illustrating an operational phase of a trained custom NN model, in accordance with an embodiment of the present disclosure. FIG. 3B is described in conjunction with elements from FIGS. 1A-1C, 2A-2D, and 3A. With reference to FIG. 3B, there is shown an operational phase 300B of the trained custom NN model 108B.

As shown in FIG. 3B, the operational phase 300B of the trained custom NN model 108B includes a series of operations 322 to 330.

At operation 322, a new color image (e.g., a RGB image) of the agricultural field is captured. In the operational phase 300B, the control circuitry 106 is further configured to capture a new color image of an agricultural field. The new color image may comprise one or more foliage regions to be detected. In accordance with an embodiment, the new color image of the agricultural field may be captured in the FOV ranging from 1.7 to 2.5 meters (or about 2 meters) of the agricultural field.

At operation 324, a specific range of pixels (e.g., 400 pixels at bottom portion) of the new color image is removed. The specific range of pixels that is required to be removed, may represent a man-made object lying in the FOV of the camera apparatus 102. The control circuitry 106 is further configured to remove a specific portion, for example, a certain range of pixels (e.g., 400 pixels from bottom) from the new color image. The portion comprises pixels indicative of an artificial object (i.e., a man-made object) in a field-of-view (FOV) of the camera apparatus 102. The artificial object, for example, may be a boom portion of an agricultural vehicle or a machine part, in the FOV of the camera apparatus 102.

At operation 326, one or more foliage regions are detected in the new color image in real time or near real time. The control circuitry 106 may be further configured to operate the trained custom NN model 108B to detect one or more foliage regions in the new color image in a real time or near real time after removal of the portion. After removal of the portion from the new color image, the control circuitry 106 is further configured to execute the trained custom NN model 108B to detect the one or more foliage regions in the new color image in the real time or near real time. In an implementation, the operation 326 may include one or more sub-operations, such as operations 326A to 326C.

At operation 326A, each pixel of the new color image may be divided by 255 in order to convert the pixel values in binary format. The reason being the trained custom NN model 108B may consider binary values. At operation 326B, the trained custom NN model 108B is executed to detect one or more foliage regions in the new color image in real time or near real time. At operation 326C, the pixel values of the new color image are multiplied by 255 in order to convert the pixel values from binary format to either integer format or floating-point format for further processing. The camera apparatus 102 identifies areas in the image that contain foliage. This could involve plants, crops, or any vegetation.

At operation 328, a spray grid corresponding to the new color image is generated, in which the detected one or more foliage regions are represented by the first binary value (e.g., "1") and the non-foliage regions are represented by the second binary value (e.g., "0"). This grid may be used to guide a spraying mechanism (such as a pesticide or fertilizer sprayer). The binary values indicate where to spray (on foliage) and where not to spray (non-foliage areas).

At operation 330, the generated spray grid is populated based on foliage masks. The spray grid is then adjusted or populated based on these foliage masks. This means that the spray grid is refined to more accurately represent the actual shape and location of the foliage as determined by the binary image of foliage masks. This operation ensures that the spray grid closely matches the real foliage areas in the agricultural field, which is useful for precise application of materials (like fertilizers or pesticides), in an example or to actuate an agricultural implement. By using the spray grid, the camera apparatus 102 driven agricultural implement (e.g., spay valves in a boom arrangement) may target specific areas for spraying, ensuring that only the necessary regions (like crops or problematic weeds) receive the treatment. This minimizes the usage of chemicals and resources.

Figure 4:
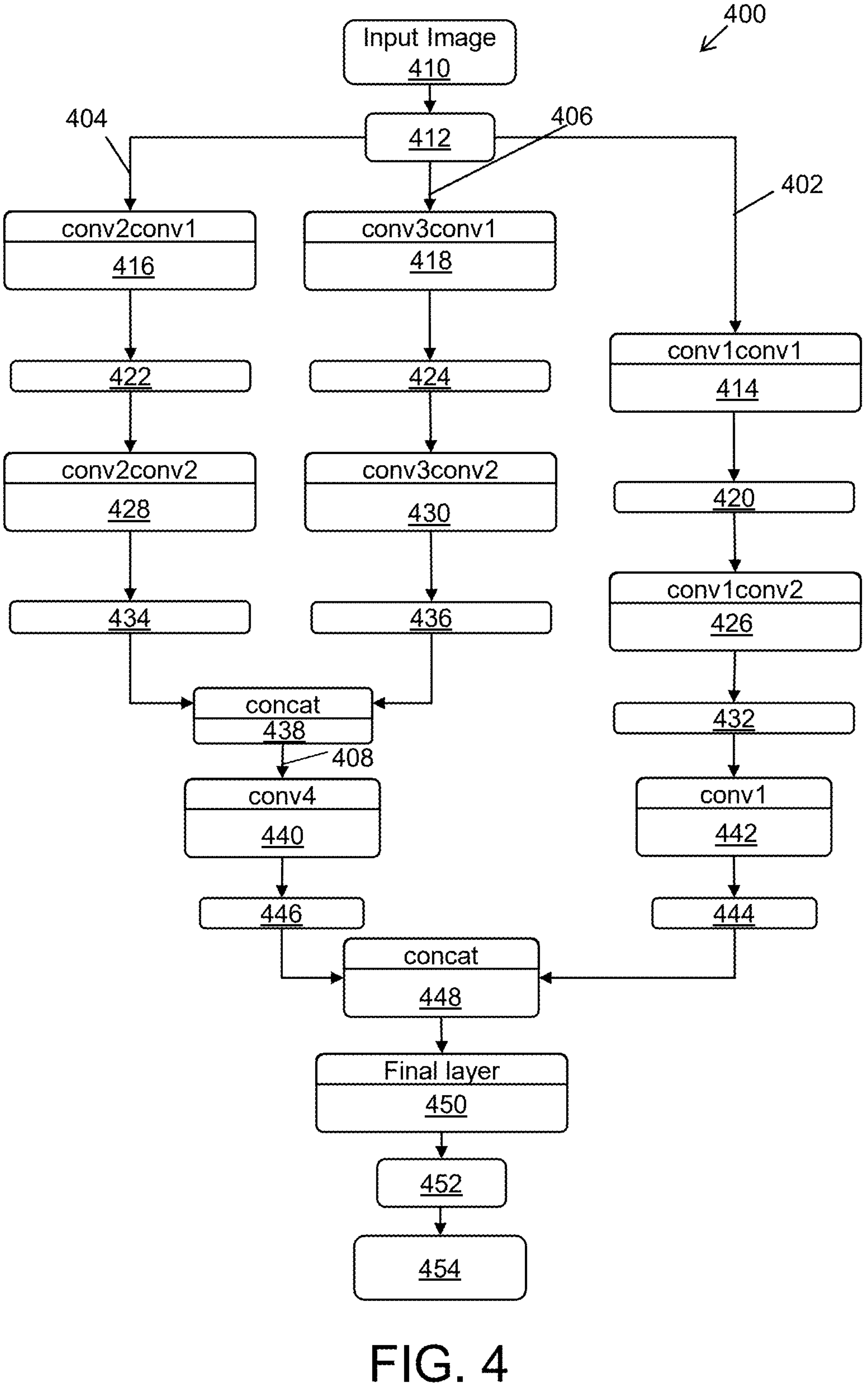
FIG. 4 is a diagram illustrating a custom-configured convolution neural network model, in accordance with an embodiment of the present disclosure.

FIG. 4 is a diagram illustrating a custom-configured convolution neural network model, in accordance with an embodiment of the present disclosure. FIG. 4 is described in conjunction with elements from FIGS. 1A-1C, 2A-2D, and 3A-3B. With reference to FIG. 4, there is shown a custom convolution neural network (CNN) model 400 having a plurality of different types of training branches namely, a first type of training branch 402 (may also be represented as/model/conv1), a second type of training branch 404 (may also be represented as/model/conv2), a third type of training branch 406 (may also be represented as/model/conv3), and a fourth type of training branch 408 (may also be represented as/model/conv4). Furthermore, there is shown an input image 410 which is passed to the custom CNN model 400 after normalization.

The custom CNN model 400 (e.g., CropScaleNet1) is a custom green foliage detection model configured to use kernel as a linear regressor to learn a predefined color and a color variation range of the predefined color. The input image 410 is a color image (i.e., RGB image) captured by the camera apparatus 102 (of FIG. 1A). At operation 412, each pixel value of the input image 410 may be normalized by dividing 255 to float values between 0 and 1. After normalization, the input image 410 is shared between different types of training branches of the custom CNN model 400, such as the first type of training branch 402, the second type of training branch 404 and the third type of training branch 406. Alternatively stated, the input image 410 is shared between a first convolution layer 414 (may also be represented as conv1conv1) of the first type of training branch 402, a first convolution layer 416 of the second type of training branch 404 (may also be represented as conv2conv1) and a first convolution layer 418 of the third type of training branch 406 (may also be represented as conv3conv1).

Each of the first type of training branch 402, the second type of training branch 404, the third type of training branch 406 and the fourth type of training branch 408 has different kernel shapes and values of other parameters. For example, the first type of training branch 402 has kernel shape of 1,1 in each convolution layer, the second type of training branch 404 has kernel shape of 5,5 in each convolution layer, the third type of training branch 406 has kernel shape of 7,7 in each convolution layer, and the fourth type of training branch 408 has kernel shape of 1,1 in each convolution layer. However, values of the other parameters may or may not be same for each of different types of training branches. For example, the values of the other parameters for the first type of training branch 402 (i.e., /model/conv1) are dilations: 1,1, pads: 0,0,0,0, and strides 1,1 in each convolution layer. Similarly, the values of the other parameters for the second type of training branch 404 (i.e., /model/conv2) are dilations: 1,1, pads: 2,2,2,2, and strides 1,1 in each convolution layer, for the third type of training branch 406 (i.e., /model/conv3) are dilations: 1,1, pads: 3,3,3,3, and strides 1,1 in each convolution layer and for the fourth type of training branch 408 (i.e., /model/conv4) are dilations: 1,1, pads: 0,0,0,0, and strides 1,1 in each convolution layer. Different kernel shapes are used independently on the input image 410 which enables the custom CNN model 400 to learn the features of the input image 410 at three scales. For example, the kernel size of value "1" converts a convolution operation in image models to a linear regression model and further enables the custom CNN model 400 to learn the color variation range of the predefined color (i.e., the green color) instead of overfitting on particular features.

Moreover, in the custom CNN model 400, each of the first type of training branch 402 and the fourth type of training branch 408 is configured to learn the color variation range of the predefined color (i.e., the green color) of foliage. And, each of the second type of training branch 404, the third type of training branch 406 is configured to learn the plurality of features related to foliage.

An output from the first convolution layer 414 of the first type of training branch 402 is passed to a first layer of rectified linear unit (may also be represented as ReLU1) 420. Similarly, an output from the first convolution layer 416 of the second type of training branch 404 and an output from the first convolution layer 418 of the third type of training branch 406 is passed to a first layer of ReLU (i.e., ReLU1) 422 and a first layer of ReLU (i.e., ReLU1) 424, respectively. Typically, ReLU is an activation function that introduces the property of non-linearity to the custom CNN model 400 and solves the vanishing gradients issue.

An output from the first layer of ReLU 420 from the first type of training branch 402 is passed to a second convolution layer 426 (may also be represented as conv1conv2) of the first type of training branch 402. Similarly, an output from the first layer of ReLU 422 of the second type of training branch 404 is passed to a second convolution layer 428 (may also be represented as conv2conv2) of the second type of training branch 404 and an output from the first layer of ReLU 424 of the third type of training branch 406 is passed a second convolution layer 430 (may also be represented as conv3conv1) of the third type of training branch 406.

An output from the second convolution layer 426 of the first type of training branch 402 is passed to a second layer of ReLU (i.e., ReLU2) 432. Similarly, an output from the second convolution layer 428 of the second type of training branch 404 and an output from the second convolution layer 430 of the third type of training branch 406 is passed to a second layer of ReLU (i.e., ReLU2) 434 and a second layer of ReLU (i.e., ReLU2) 436, respectively.

At operation 438, an output from the second layer of ReLU 434 of the second type of training branch 404 and an output from the second layer of ReLU 436 of the third type of training branch 406 are concatenated and passed to the fourth type of training branch 408 or a first convolution layer 440 (may also be represented as conv4) of the fourth type of training branch 408.

An output from the second layer of ReLU 432 from the first type of training branch 402 is passed to a third convolution layer 442 of the first type of training branch 402.

An output from the third convolution layer 442 of the first type of training branch 402 is passed to a third layer of ReLU (i.e., ReLU3) 444. Similarly, an output from the first convolution layer 440 of the fourth type of training branch 408 is passed to a third layer of ReLU (i.e., ReLU3) 446.

At operation 448, an output from the third layer of ReLU (i.e., ReLU3) 444 of the first type of training branch 402 and an output from the third layer of ReLU (i.e., ReLU3) 446 of the fourth type of training branch 408 are concatenated and passed to a final layer 450 of the custom CNN model 400. The final layer 450 is configured to generate a first binary mask image of the input image 410.

At operation 452, a filter is used to clip off the small regions of noise (regions less than a threshold size) from the first binary mask image.

At operation 454, an output binary mask image is generated. The output binary mask image is a black and white image, where the white regions signify the presence of green foliage.

The custom CNN model 400 is different from a conventional CNN model in various ways. For example, the conventional CNN model is merely focused on learning the plurality of features whereas, the custom CNN model 400 is not only focused on learning the plurality of features related to foliage but also, focused on learning the color variation range of foliage. Moreover, in the conventional CNN model, all the convolution layers are mostly fully connected which, is not in the custom CNN model 400 and hence, the custom CNN model 400 manifests simplicity, less computation time as well as enhanced performance and reliability in real time or near real time over the conventional CNN model.

Figure 5:
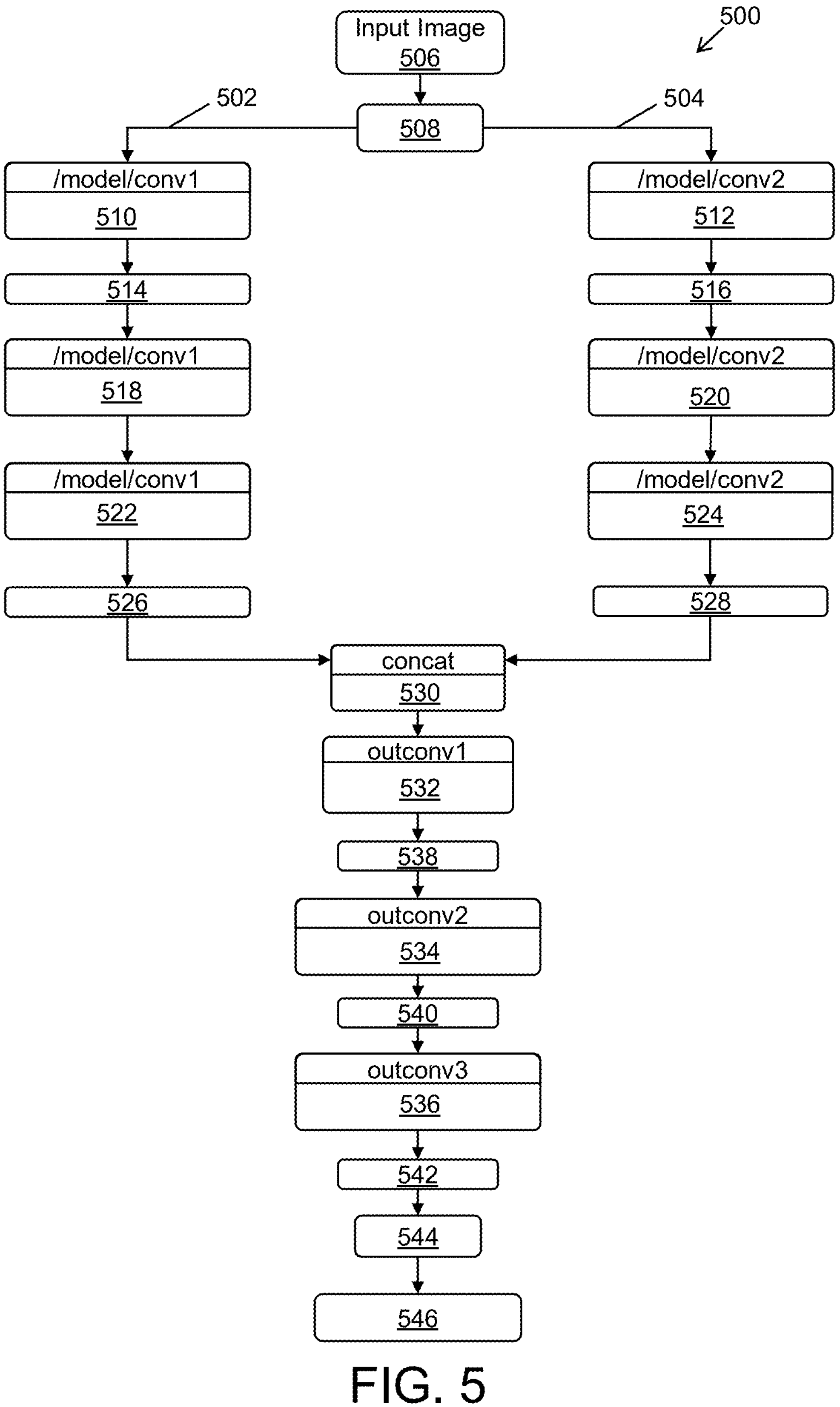
FIG. 5 is a diagram illustrating a custom-configured convolution neural network model, in accordance with another embodiment of the present disclosure.

FIG. 5 is a diagram illustrating a custom-configured convolution neural network model, in accordance with another embodiment of the present disclosure. FIG. 5 is described in conjunction with elements from FIGS. 1A-1C, 2A-2D, 3A-3B and 4. With reference to FIG. 5, there is shown a custom CNN model 500 having a plurality of different types of training branches namely, a first type of training branch 502 (may also be represented as/model/conv1), and a second type of training branch 504 (may also be represented as/model/conv2). Furthermore, there is shown an input image 506 which is passed to the custom CNN model 500 after normalization.

The custom CNN model 500 (e.g., CropScaleNet6) is an improved version of the custom CNN model 400 (of FIG. 4). The input image 506 is a color image (i.e., RGB image) captured by the camera apparatus 102 (of FIG. 1A). At operation 508, each pixel value of the input image 506 is normalized by dividing 255 to float values between 0 and 1. After normalization, the input image 506 is shared between different types of training branches of the custom CNN model 500, such as the first type of training branch 502 and the second type of training branch 504. Alternatively stated, the input image 506 is shared between a first convolution layer 510 of the first type of training branch 502 and a first convolution layer 512 of the second type of training branch 504.

Each of the first type of training branch 502 and the second type of training branch 504 has different kernel shapes. For example, the first type of training branch 502 has kernel shape of 3,3 in each convolution layer, and the second type of training branch 504 has kernel shape of 5,5 in each convolution layer. In the custom CNN model 500, an individual branch is different from the custom CNN model 400 (of FIG. 4) by an additional layer present at the end of the branch. This compensates for the removed branch in the custom CNN model 400 without affecting accuracy. Based on a number of experiments, it has been observed that the use of kernel size of 3 in the first type of training branch 502 assists the custom CNN model 500 to learn the color variation range along with the context better than kernel size of 1 (used in the custom CNN model 400). Also, the use of kernel size of 5 in the second type of training branch 504 assists the custom CNN model 500 to learn the plurality of features in an improved way and thus, causes the custom CNN model 500 to reduce false positive detections in comparison to the custom CNN model 400.

An output from the first convolution layer 510 of the first type of training branch 502 is passed to a first layer of ReLU (i.e., ReLU1) 514 in the first type of training branch 502. Similarly, an output from the first convolution layer 512 of the second type of training branch 504 is passed to a first layer of ReLU (i.e., ReLU1) 516 in the second type of training branch 504.

An output from the first layer of ReLU 514 from the first type of training branch 502 is passed to a second convolution layer 518 of the first type of training branch 502. Similarly, an output from the first layer of ReLU 516 of the second type of training branch 504 is passed to a second convolution layer 520 of the second type of training branch 504.

An output from the second convolution layer 518 of the first type of training branch 502 is passed to a third convolution layer 522 of the first type of training branch 502. Similarly, an output from the second convolution layer 520 of the second type of training branch 504 is passed to a third convolution layer 524 of the second type of training branch 504.

An output from the third convolution layer 522 of the first type of training branch 502 is passed to a second layer of ReLU (i.e., ReLU2) 526. Similarly, an output from the third convolution layer 524 of the second type of training branch 504 is passed to a second layer of ReLU (i.e., ReLU2) 528.

At operation 530, an output from the second layer of ReLU 526 of the first type of training branch 502 and an output from the second layer of ReLU 528 of the second type of training branch 504 are concatenated and passed to a set of final layers, for example, a first final layer 532 followed by a second final layer 534 and a third final layer 536. An output from the first final layer 532 is passed to the second final layer 534 after passing through a first final layer of ReLU 538. Similarly, an output from the second final layer 534 is passed to the third final layer 536 after passing through a second final layer of ReLU 540. An output from the third final layer 536 is passed through a third final layer of ReLU 542 to generate a first binary mask image of the input image 506.

At operation 544, a filter is used to clip off the small-small regions of noise from the first binary mask image.

At operation 546, an output binary mask image is generated. The output binary mask image is a black and white image, where the white regions signify the presence of green foliage.

Figure 6:
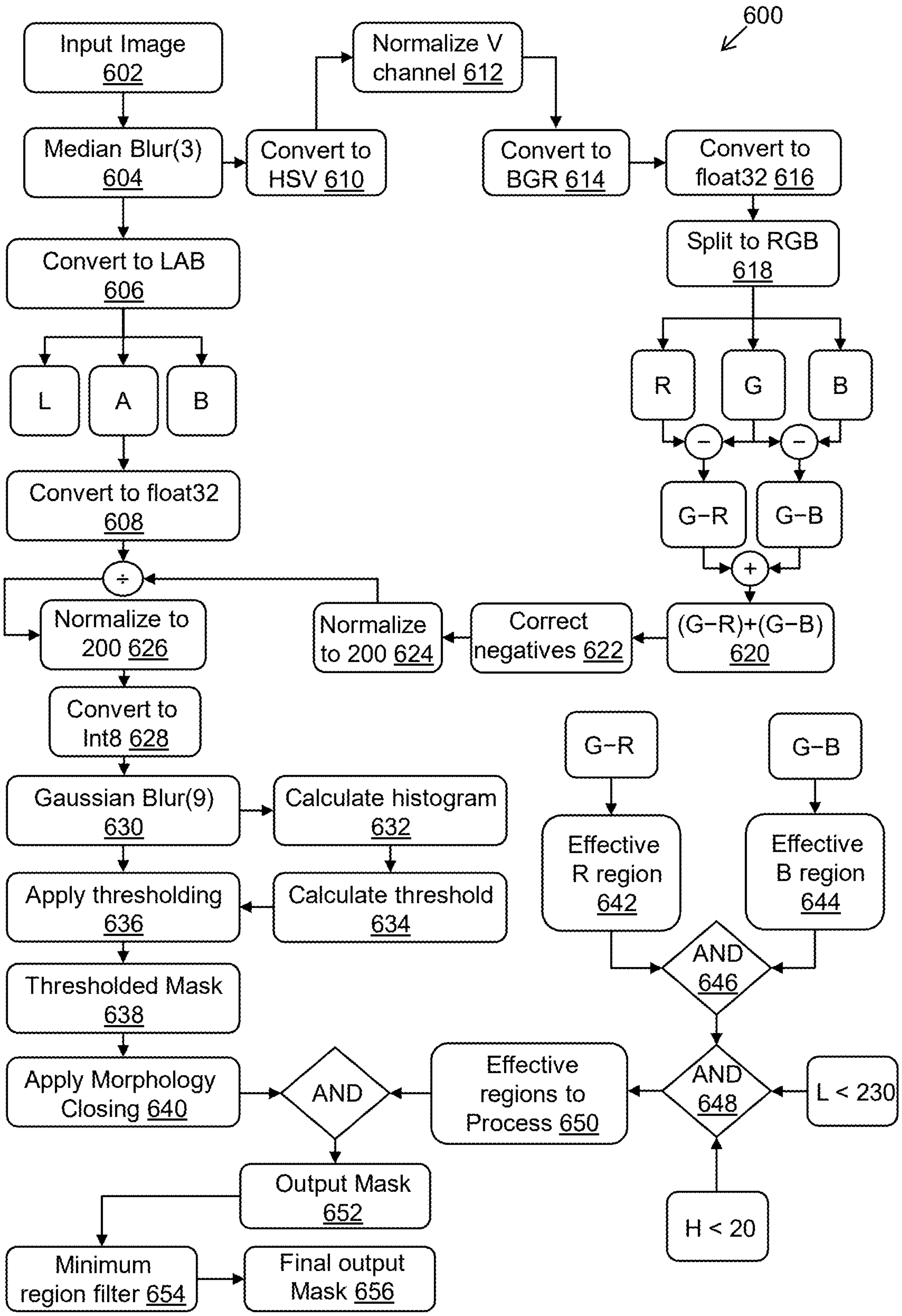
FIG. 6 is a diagram illustrating a flowchart of generating an output binary image of foliage mask, in accordance with an embodiment of the present disclosure.

FIG. 6 is a diagram illustrating a flowchart of generating an output binary image of foliage mask, in accordance with an embodiment of the present disclosure. FIG. 6 is described in conjunction with elements from FIGS. 1A-1C, 2A-2D, 3A-3B, 4 and 5. With reference to FIG. 6, there is shown a flowchart 600 that includes a series of operations 602 to 656. The flowchart 600 is used in training of the custom NN model 108A and executed by the control circuitry 106 of the camera apparatus 102.

At operation 602, an input color image comprising one or more foliage regions is acquired in the FOV of the agricultural field.

At operation 604, the input color image is smoothened by use of the median blur and a smoothened input color image is generated. The smoothened input color image has even brightness and converted to a plurality of different color spaces.

At operation 606, the smoothened input color image is subjected to a first color space of the plurality of different color spaces. The first color space is a LAB color space. Each component (i.e., L, A and B) of the LAB color space is segregated for processing the smoothened input color image. The L-component represents lightness on a scale from 0 (i.e., black) to 100 (i.e., white). The A-component represents a green-red opponent channel, where positive values indicate redness and negative values indicate greenness. The B-component represents a blue-yellow opponent channel, where positive values indicate yellowness and negative values indicate blueness.

At operation 608, after processing through the LAB color space, the image values of the smoothened input color image are converted to floating point values (e.g., float32).

At operation 610, the smoothened input color image is represented in a different form by use of a HSV channel where, HSV stands for hue, saturation and value, respectively. Alternatively stated, the HSV channel corresponds to a different representation of the smoothened input color image. In the HSV channel, H (hue) represents which colors are present in the smoothened input color image. The value of H is different for different colors, for example, for green color, H will have a certain value, for red color, H will have another value, and the like. S (saturation) represents amount of colors present in the smoothened input color image and V (value) is for brightness. For a given pixel, how bright is that pixel is represented by V. The brighter regions of the smoothened input color image have larger values of V and darker regions have lower values of V.

At operation 612, normalization of the smoothened input color image is performed in the V channel.

At operation 614, after normalization, the smoothened input color image is converted to a BGR (Blue-Green-Red) color space.

At operation 616, the image values of the smoothened input color image are converted to floating point values (i.e., float32).

At operation 618, the smoothened input color image is subjected to a second color space of the plurality of different color spaces. The second color space is a RGB color space. Each component (i.e., R, G, and B) of the RGB color space is segregated for the smoothened input color image. Thereafter, a first difference between a green channel intensity and a red channel intensity (i.e., G−R) and a second difference between the green channel intensity and a blue channel intensity (i.e., G−B) is computed, for the segregated components of the RGB color space. Thereafter, the first difference and the second difference are summed up to obtain a summed output (i.e., (G−R)+ (G−B)).

At operation 620, the summed output is generated used for execution of a number of channel operations in a second color space processing path associated with the second color space (i.e., RGB color space). By combining the two differences, the summed output (i.e., (G−R)+ (G−B)) creates a more robust indicator of foliage presence (i.e., an enhanced foliage signal), even in challenging lighting conditions or with variations in foliage green-colors. Furthermore, the summed output condenses foliage-related information into a single value (representing the overall strength of green relative to red and blue), simplifying subsequent processing steps and reducing computational overhead.

At operation 622, negative values are corrected to ensure they fall within the valid range of the RGB color space. This correction is useful for accurate and realistic color representation in the final image output. The correction might involve setting all negative values to zero (as RGB values are typically in the range of 0 to 255) or adjusting them based on a specific algorithmic rule. For example, pixels with negative summed output may be efficiently eliminated from the summed output as they are unlikely to represent foliage. This operation may be also referred to as negatives values correction or simply negatives correction. The negative values are observed to be associated with noise or non-foliage elements, so removing them improves detection accuracy. For example, consider a pixel with (G−R)=40 and (G−B)=30. The summed output would be 70, strongly suggesting foliage. Further, a pixel with (G−R)=−10 and (G−B)=5 would have a summed output of −5, indicating a low probability of foliage and potential exclusion.

At operation 624, the image values are normalized to 200. Each pixel value in the image is adjusted to fall within a range of 0 to 200. This ensures consistency and comparability across different colors, images and restricting the pixels from being saturated. Thereafter, the image values (i.e., the floating-point values) of the smoothened input color image obtained from the first color space (i.e., LAB color space) are divided by the image values (which are normalized to 200) of the smoothened input color image obtained from the second color space (i.e., RGB color space).

At operation 626, the image values of a divided image are normalized to 200. The image output from operation 608 and operation 624 is divided and the divided image is normalized in this operation.

At operation 628, the image values of the smoothened input color image (from the operation 626) are converted to an integer format (e.g., int8 format).

At operation 630, the smoothened input color image is blurred by use of a Gaussian function (may also be referred to as a Gaussian blur). The Gaussian blur is used to reduce noise from the smoothened input color image. After applying the Gaussian blur, a normalized image is generated.

At operation 632, a histogram of the normalized image is computed.

At operation 634, a threshold value is determined based on the histogram of the normalized image. The details of determining of the threshold value is further explained in detail, for example, in FIG. 9

At operation 636, the determined threshold value is applied on the normalized image.

At operation 638, after applying the determined threshold value, a first binary mask image (i.e., a threshold mask) is generated.

At operation 640, one or more morphology operations are applied on the first binary mask image (i.e., the threshold mask).

At operation 642, a first effective region is determined using the first difference between the green channel intensity and the red channel intensity. The first effective region is indicative of areas in the smoothened input color image where red color is more prominent compared to rest of the smoothened input color image.

At operation 644, a second effective region is determined using the second difference between the green channel intensity and the blue channel intensity. The second effective region is indicative of areas in the smoothened input color image where blue color is more prominent compared to rest of the smoothened input color image.

At operation 646, the first effective region and the second effective region are combined together.

At operation 648, the combination of the first effective region, the second effective region and the L-component (e.g., L<230) representing lightness of the LAB color space in the identification of the one or more image regions that meet the defined criteria to be considered as the foliage, is utilized. Furthermore, a hue component (e.g., H<20) of the HSV channel is also used along with the combination of the first effective region, the second effective region, and the L-component.

At operation 650, effective regions are processed. The effective regions correspond to all the regions that contain foliage with a slight color tolerance. The foliage regions chosen would be between yellowish-green to bluish green rather than stricter green regions. The chosen foliage regions do not have black and saturated regions. Moreover, the size of the foliage regions is based on the presence of foliage in the image. The color variation range can be from RGB (G+20, G, G+20) to RGB (<G, G, <G).

At operation 652, an output binary mask image is generated based on the applied one or more morphology operations and the identified image regions that meet a defined criteria to be considered as foliage (i.e., the foliage regions processed at the operation 650).

At operation 654, a filter is applied on the output binary mask image to remove isolated regions and noise and an optimized binary image of foliage mask is generated at operation 656.

Figure 7:
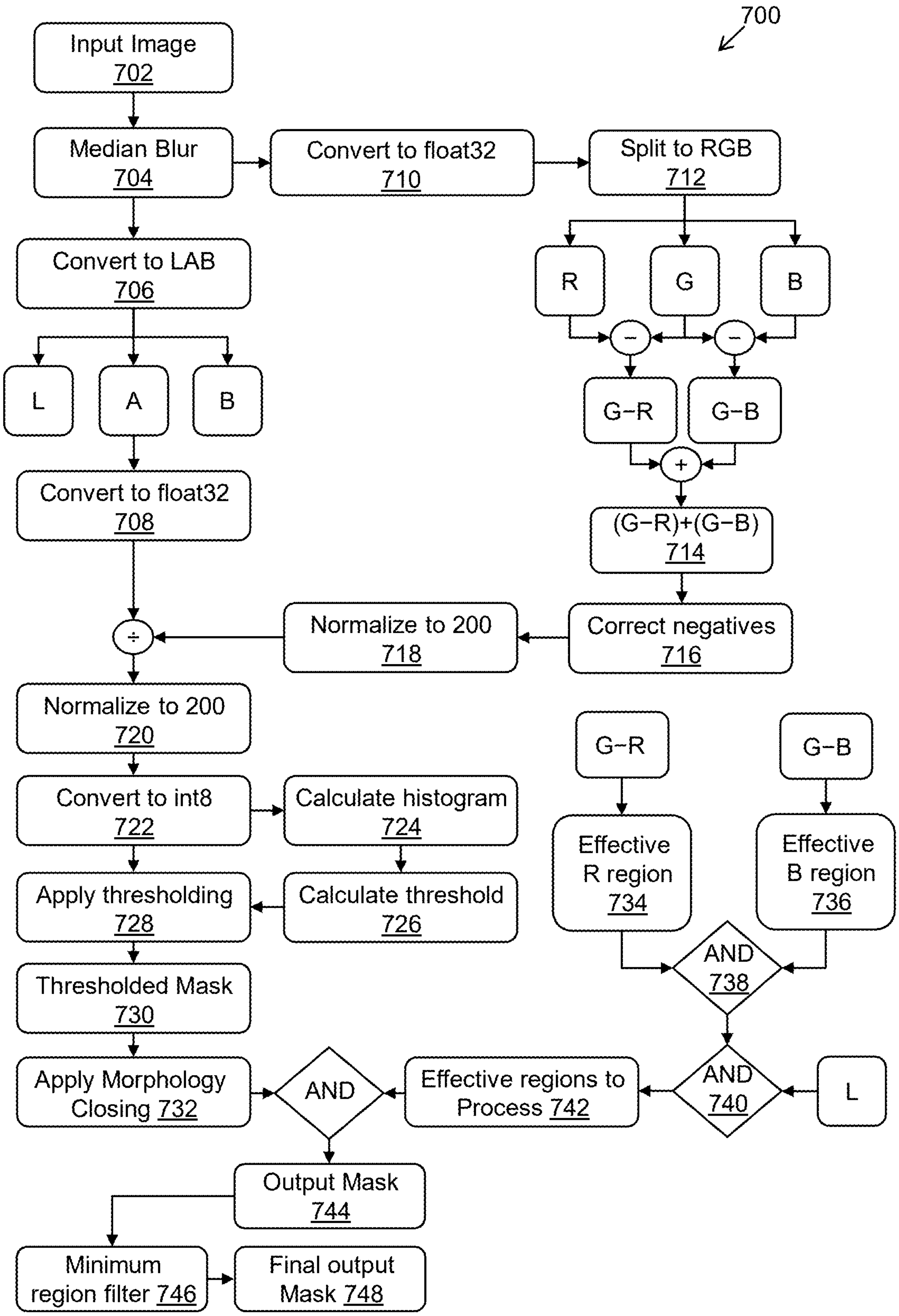
FIG. 7 is a diagram illustrating a flowchart of generating an output binary image of foliage mask, in accordance with another embodiment of the present disclosure.

FIG. 7 is a diagram illustrating a flowchart of generating an output binary image of foliage mask, in accordance with another embodiment of the present disclosure. FIG. 7 is described in conjunction with elements from FIGS. 1A-1C, 2A-2D, 3A-3B, 4, 5 and 6. With reference to FIG. 7, there is shown a flowchart 700 that includes a series of operations 702 to 748. The flowchart 700 is used in training of the custom NN model 108A and executed by the control circuitry 106 of the camera apparatus 102.

At operation 702, an input color image comprising one or more foliage regions is acquired in the FOV of the agricultural field.

At operation 704, the input color image is smoothened by use of the median blur and a smoothened input color image is generated. The smoothened input color image has even brightness and subjected to a plurality of different color spaces.

At operation 706, the smoothened input color image is subjected to a first color space of the plurality of different color spaces. The first color space is a LAB color space. Each component (i.e., L, A and B) of the LAB color space is segregated for processing the smoothened input color image. The L-component represents lightness on a scale from 0 (i.e., black) to 100 (i.e., white). The A-component represents a green-red opponent channel, where positive values indicate redness and negative values indicate greenness. The B-component represents a blue-yellow opponent channel, where positive values indicate yellowness and negative values indicate blueness.

At operation 708, after processing through the LAB color space, the image values of the smoothened input color image are converted to floating point values (e.g., float32).

At operation 710, the image values of the smoothened input color image are converted to floating point values (i.e., float32).

At operation 712, the smoothened input color image is subjected to a second color space of the plurality of different color spaces. The second color space is a RGB color space. Each component (i.e., R, G, and B) of the RGB color space is segregated for the smoothened input color image. Thereafter, a first difference between a green channel intensity and a red channel intensity (i.e., G−R) and a second difference between the green channel intensity and a blue channel intensity (i.e., G−B) is computed, for the segregated components of the RGB color space. Thereafter, the first difference and the second difference are summed up to obtain a summed output (i.e., (G−R)+ (G−B)).

At operation 714, the summed output is used for execution of a number of channel operations in a second color space processing path associated with the second color space (i.e., RGB color space).

At operation 716, negative values are corrected to ensure they fall within the valid range of the RGB color space. This correction is useful for accurate and realistic color representation in the final image output. The correction might involve setting all negative values to zero (as RGB values are typically in the range of 0 to 255) or adjusting them based on a specific algorithmic rule.

At operation 718, the image values are normalized to 200. Each pixel value in the image is adjusted to fall within a range of 0 to 200. This ensures consistency and comparability across different colors and images. Thereafter, the image values (i.e., the floating-point values) of the smoothened input color image obtained from the first color space (i.e., LAB color space) are divided by the image values (which are normalized to 200) of the smoothened input color image obtained from the second color space (i.e., RGB color space).

At operation 720, the image values of the smoothened input color image are normalized to 200.

At operation 722, the image values of the smoothened input color image are converted to an integer format (e.g., int8 format).

At operation 724, a histogram of the smoothened input color image (by considering that the image values are converted to the integer format) is computed.

At operation 726, a threshold value is determined based on the computed histogram. The details of determining the threshold value are further explained in detail, for example, in FIG. 9.

At operation 728, the determined threshold value is applied on the smoothened input color image.

At operation 730, after applying the determined threshold value, a first binary mask image (i.e., a threshold mask) is generated.

At operation 732, one or more morphology operations are applied on the first binary mask image (i.e., the threshold mask).

At operation 734, a first effective region is determined using the first difference between the green channel intensity and the red channel intensity. The first effective region is indicative of areas in the smoothened input color image where red color is more prominent compared to rest of the smoothened input color image.

At operation 736, a second effective region is determined using the second difference between the green channel intensity and the blue channel intensity. The second effective region is indicative of areas in the smoothened input color image where blue color is more prominent compared to rest of the smoothened input color image.

At operation 738, the first effective region and the second effective region are combined together.

At operation 740, the combination of the first effective region, the second effective region and the L-component representing lightness of the LAB color space in the identification of the one or more image regions that meet the defined criteria to be considered as the foliage, is utilized.

At operation 742, effective regions are processed. The effective regions correspond to all the regions that contain foliage with a slight color tolerance. The foliage regions chosen would be between yellowish-green to bluish green rather than stricter green regions. The chosen foliage regions do not have black and saturated regions. Moreover, the size of the foliage regions is based on the presence of foliage in the image. The color variation range can be from RGB (G+red tolerance, G, G+blue tolerance) to RGB (<G, G, <G).

At operation 744, an output binary mask image is generated based on the applied one or more morphology operations and the identified image regions that meet a defined criteria to be considered as foliage (i.e., the foliage regions processed at the operation 650).

At operation 746, a filter is applied on the output binary mask image to remove isolated regions and noise and an optimized binary image of foliage mask is generated at operation 748.

Figure 8:
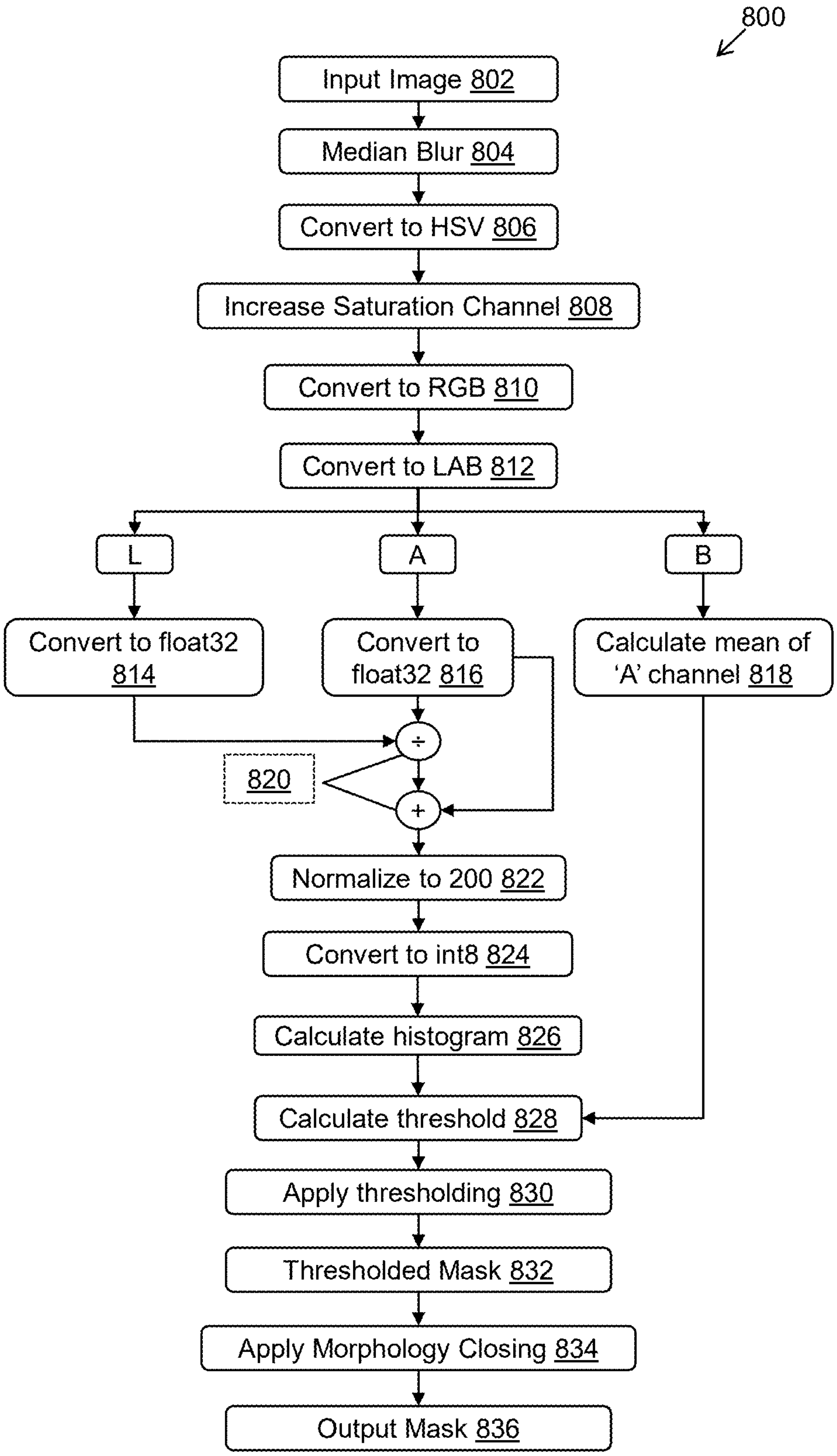
FIG. 8 is a diagram illustrating a flowchart of generating an output binary image of foliage mask, in accordance with yet another embodiment of the present disclosure.

FIG. 8 is a diagram illustrating a flowchart of generating an output binary image of foliage mask, in accordance with yet another embodiment of the present disclosure. FIG. 8 is described in conjunction with elements from FIGS. 1A-1C, 2A-2D, 3A-3B, 4, 5, 6 and 7. With reference to FIG. 8, there is shown a flowchart 800 that includes a series of operations 802 to 836. The flowchart 800 is used in training of the custom NN model 108A and executed by the control circuitry 106 of the camera apparatus 102.

At operation 802, an input color image comprising one or more foliage regions is acquired in the FOV of the agricultural field.

At operation 804, the input color image is smoothened by use of the median blur and a smoothened input color image is generated. The smoothened input color image has even brightness.

At operation 806, the smoothened input color image is represented in a different form by use of a HSV channel where, HSV stands for hue, saturation and value, respectively. Alternatively stated, the HSV channel corresponds to a different representation of the smoothened input color image.

At operation 808, a value of the saturation (i.e., S) component of the HSV channel is increased which, further increases the contrast between various colors present in the smoothened input color image.

At operation 810, the smoothened input color image is subjected to RGB color space.

At operation 812, the smoothened input color image is subjected to the LAB color space. Each component (i.e., L, A and B) of the LAB color space is segregated for processing the smoothened input color image. The L-component represents lightness on a scale from 0 (i.e., black) to 100 (i.e., white). The A-component represents a green-red opponent channel, where positive values indicate redness and negative values indicate greenness. The B-component represents a blue-yellow opponent channel, where positive values indicate yellowness and negative values indicate blueness.

For example, in an implementation scenario, the smoothened input color image may have green and reddish-brown color only. The L component represents intensity of different colors (i.e., the green and reddish-brown color). The A component represents the difference or gradient between red and green color. Since, the smoothened input color image does not have any blue color, therefore, B component of the LAB color space is not used in the considered implementation scenario.

At operation 814, after applying the L component of the LAB color space on the smoothened input color image, the image values of the smoothened input color image are converted to floating point values (e.g., float32).

At operation 816, after applying the A component of the LAB color space on the smoothened input color image, the image values of the smoothened input color image are converted to floating point values (i.e., float32).

At operation 818, after applying the A component of the LAB color space on the smoothened input color image, a mean value of the smoothened input color image is computed and used in computing a threshold value at operation 828.

At operation 820, the image values (i.e., the floating-point values) of the smoothened input color image, which are obtained after application of the L component, are divided by the image values (i.e., the floating-point values) of the smoothened input color image, which are obtained after application of the A component and resultant values are summed up with the image values (i.e., the floating-point values) of the smoothened input color image, obtained, after application of the A component, to obtain summed output image values.

At operation 822, the summed output image values are normalized to 200.

At operation 824, the summed output image values are converted to an integer format (e.g., int8 format).

At operation 826, a histogram of the summed output image values, is computed.

At operation 828, a threshold value is determined based on the computed histogram.

At operation 830, the determined threshold value is applied on the summed output image values.

At operation 832, after applying the determined threshold value, a first binary mask image (i.e., a threshold mask) is generated.

At operation 834, one or more morphology operations are applied on the first binary mask image (i.e., the threshold mask).

At operation 836, an output binary mask image is generated based on the applied one or more morphology operations on the first binary mask image (i.e., the threshold mask).

Moreover, in the flowchart 800, different shades of the green color, such as the bluish green, reddish green, and the yellowish green are not considered, and only the green pixels are enhanced by use of the saturation (i.e., S) component of the HSV channel.

Figure 9:
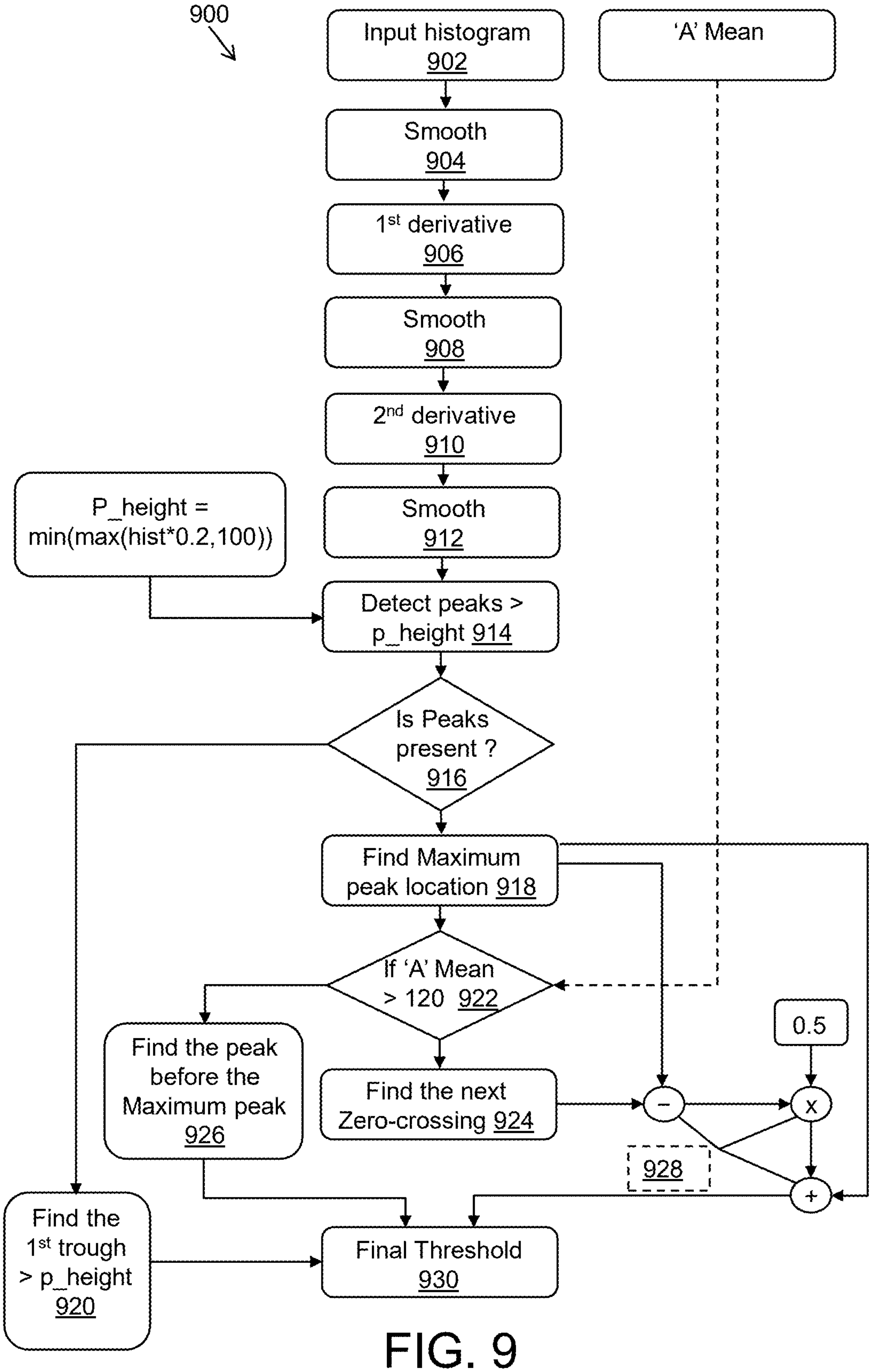
FIG. 9 is a diagram illustrating a flowchart of computing a threshold value, in accordance with an embodiment of the present disclosure.

FIG. 9 is a diagram illustrating a flowchart of computing a threshold value, in accordance with an embodiment of the present disclosure. FIG. 9 is described in conjunction with elements from FIGS. 1A-1C, 2A-2D, 3A-3B, 4, 5, 6, 7, and 8. With reference to FIG. 9, there is shown a flowchart 900 that includes a series of operations 902 to 930. The control circuitry 106 of the camera apparatus 102 is configured to execute the flowchart 900.

At operation 902, a histogram is used as an input. For computing the histogram, an input color image is acquired. The input color image is smoothened by use of median blur and a smoothened input color image is generated. The smoothened input color image is converted to a plurality of color spaces, such as LAB color space, RGB color space. After processing through one of the plurality of color spaces, for example, the LAB color space, image values of the smoothened input color image are converted to floating point values (e.g., float32). Thereafter, the image values of the smoothened input color images are normalized to 200 and converted to an integer format (e.g., int8 format). Thereafter, the histogram of the smoothened input color image (by considering that the image values are converted to the integer format) is computed.

At operation 904, smoothening of the histogram is performed to generate a smoothened histogram.

At operation 906, a first derivative of the smoothened histogram is computed.

At operation 908, smoothening is performed on the computed first derivates.

At operation 910, a second derivative is computed from smoothened first derivatives.

At operation 912, smoothening is performed on the computed second derivatives.

At operation 914, peaks having a value greater than a threshold value are detected. For example, the threshold value (may be represented as p_height) is equivalent to min(max(hist*0.2,100)).

At operation 916, if peaks having the value greater than the threshold value are present then, an operation 918 is executed, else, an operation 920 is executed.

At operation 918, location of a peak having the maximum value (i.e., maximum peak) is identified.

At operation 922, if mean of the A component of the LAB color space is greater than 120 then, an operation 924 is executed, else, an operation 926 is executed.

At operation 924, location of next zero crossing(s) is identified.

At operation 926, a peak before the maximum peak is identified.

At operation 928, the location of next zero crossing is subtracted from the location of the peak having the maximum value and a resultant value is multiplied with 0.5 and added to a final threshold value at an operation 930.

At operation 920, a first trough having height greater than the threshold value (i.e., p_height) is identified and added to the final threshold value. Moreover, the peak found before the maximum peak is also added to the final threshold value. In this way, the final threshold value is computed, which is used in generation of an output binary mask image, as described, for example, in FIGS. 6, 7 and 8.

Figure 10:
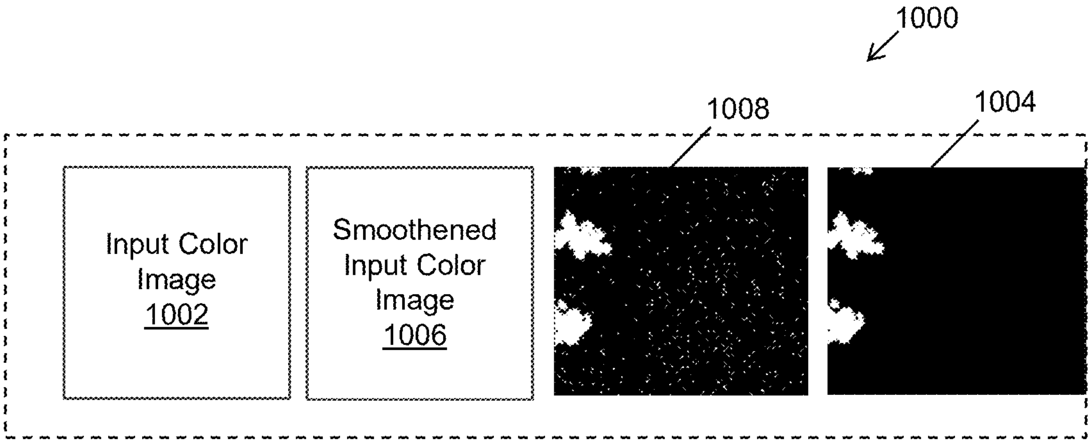
FIG. 10 is a diagram illustrating an exemplary scenario of generation of an output binary mask image from an input color image, in accordance with an embodiment of the present disclosure.

FIG. 10 is a diagram illustrating an exemplary scenario of generation of an output binary mask image from an input color image, in accordance with an embodiment of the present disclosure. FIG. 10 is described in conjunction with elements from FIGS. 1A-1C, 2A-2D, 3A-3B, 4, 5, 6, 7, 8 and 9. With reference to FIG. 10, there is shown an exemplary scenario 1000 that illustrates generation of an output binary mask image 1004 from an input color image 1002.

The input color image 1002 is an RGB color image captured in the FOV of the agricultural field. The input color image 1002 comprises one or more foliage regions and one or more non-foliage regions. The input color image 1002 is smoothened by use of median blur and a smoothened input color image 1006 is generated. The smoothened input color image 1006 is converted into a plurality of different color spaces, such as a LAB color space or RGB color space (described in detail, for example, in FIGS. 6A-6B). Furthermore, a set of channel operations on an individual channel or combined channels are executed, in each color space of the plurality of different color spaces, to enhance green pixels and suppress other pixels. The green pixels are indicative of the one or more foliage regions. Thereafter, a threshold value is applied on the smoothened input color image 1006 to obtain a first binary mask image 1008 followed by applying one or more morphology operations on the first binary mask image 1008 to remove noise present in the first binary mask image 1008. Finally, the output binary mask image 1004 is generated, which is a black and white image, where white regions represent the one or more foliage regions and black regions represent the one or more non-foliage regions.

Figure 11:
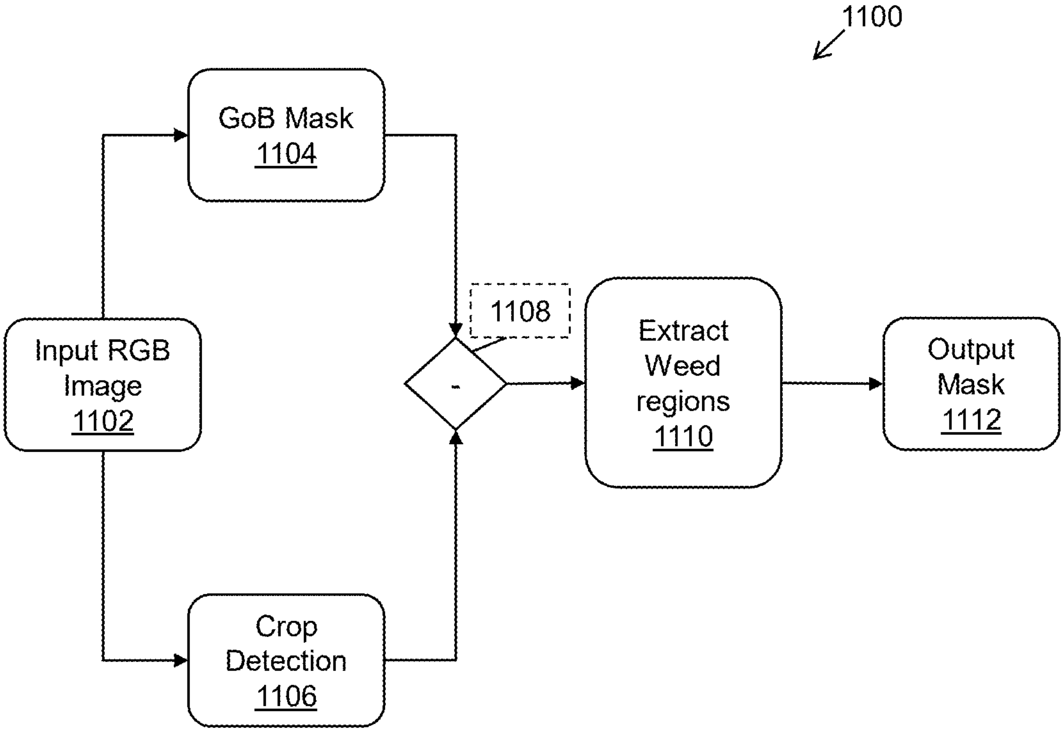
FIG. 11 a diagram illustrating an exemplary application scenario of foliage detection, in accordance with an embodiment of the present disclosure.

FIG. 11 is a diagram illustrating an exemplary application scenario of foliage detection, in accordance with an embodiment of the present disclosure. FIG. 11 is described in conjunction with elements from FIGS. 1A-1C, 2A-2D, 3A-3B, 4, 5, 6, 7, 8, 9, and 10. With reference to FIG. 11, there is shown an exemplary application scenario 1100 of foliage detection. With reference to the exemplary application scenario 1100, there is shown an input RGB image 1102 from which an output binary mask image 1104 (may also be referred to as a GoB mask image) is generated by use of the custom NN model 108A and the trained custom NN model 108B (of FIG. 1A). The output binary mask image 1104 includes masks for one or more foliage regions. Moreover, from the input RGB image 1102, one or more regions with plants of interest (e.g., crop plants) are detected at an operation 1106. Thereafter, the detected one or more regions with crop plants are subtracted from the output binary mask image 1104 at an operation 1108, which leads to the extraction of weed regions at an operation 1110. Finally, an output binary image 1112 is generated which includes masks for the extracted weed regions.

FIGS. 12A, 12B, 12C, and 12D, collectively is a diagram illustrating a flowchart of a method of foliage detection, in accordance with an embodiment of the present disclosure. FIGS. 12A-12D are described in conjunction with elements from FIGS. 1A-1C, 2A-2D, 3A-3B, 4, 5, 6, 7, 8, 9, 10, and 11. With reference to FIGS. 12A-12D, there is shown a method 1200 that includes operations 1202 to 1228. The control circuitry 106 of the camera apparatus 102 (of FIG. 1A) is configured to execute the method 1200.

Figure 12A:
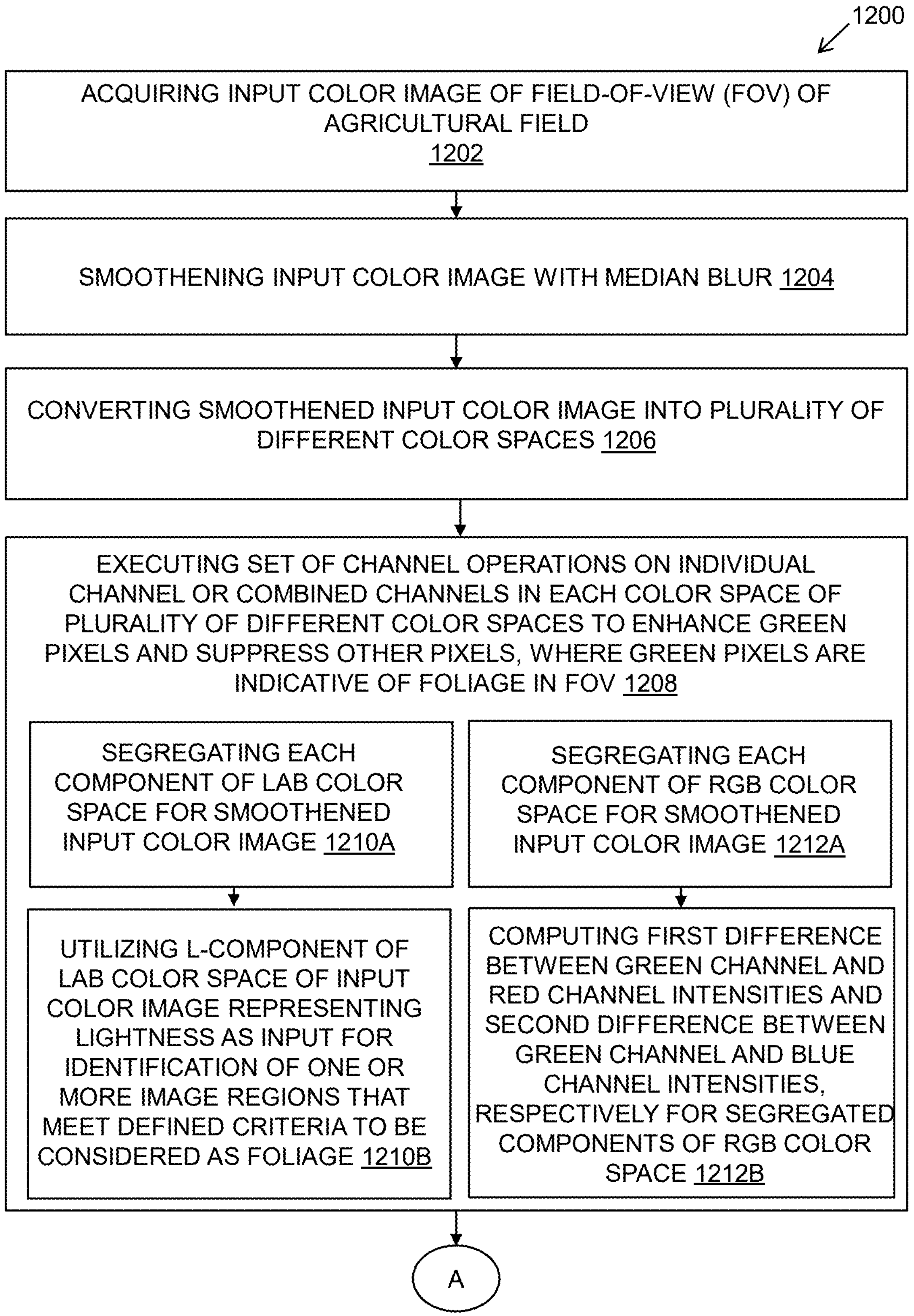
FIGS. 12A, 12B, 12C, and 12D, collectively is a diagram illustrating a flowchart of a method of foliage detection, in accordance with an embodiment of the present disclosure.

Referring to FIG. 12A, at 1202, an input color image of a field-of-view (FOV) of an agricultural field is acquired. The FOV of input color image ranges from 1.75 to 2.25 meters of the agricultural field. At 1204, the input color image is smoothened by use of a median blur and a smoothened input color image is generated.

At 1206, the smoothened input color image is converted into a plurality of different color spaces.

At 1208, a set of channel operations is executed on an individual channel or combined channels in each color space of the plurality of different color spaces to enhance green pixels and suppress other pixels, where the green pixels are indicative of foliage, where a first color space of the plurality of different color spaces is a LAB color space, and a second color space of the plurality of different color spaces is a RGB color space. The operation 1208 comprises a plurality of sub-operations, such as operations 1210A to 1210C and 1212A to 1212C. At 1210A, each component of the LAB color space is segregated for the smoothened input color image. Similarly, at 1212A, each component of the RGB color space is segregated for the smoothened input color image. At 1210B, a L-component representing lightness of the LAB color space of the input color image is utilized as an input for the identification of the one or more image regions that meet the defined criteria to be considered as the foliage. At 1212B, a first difference (i.e., G−R) between a green channel intensity (i.e., G) and a red channel intensity (i.e., R) and a second difference (i.e., G−B) between the green channel intensity (i.e., G) and a blue channel intensity (i.e., B) respectively, is computed, for the segregated components of the RGB color space.

Figure 12B:
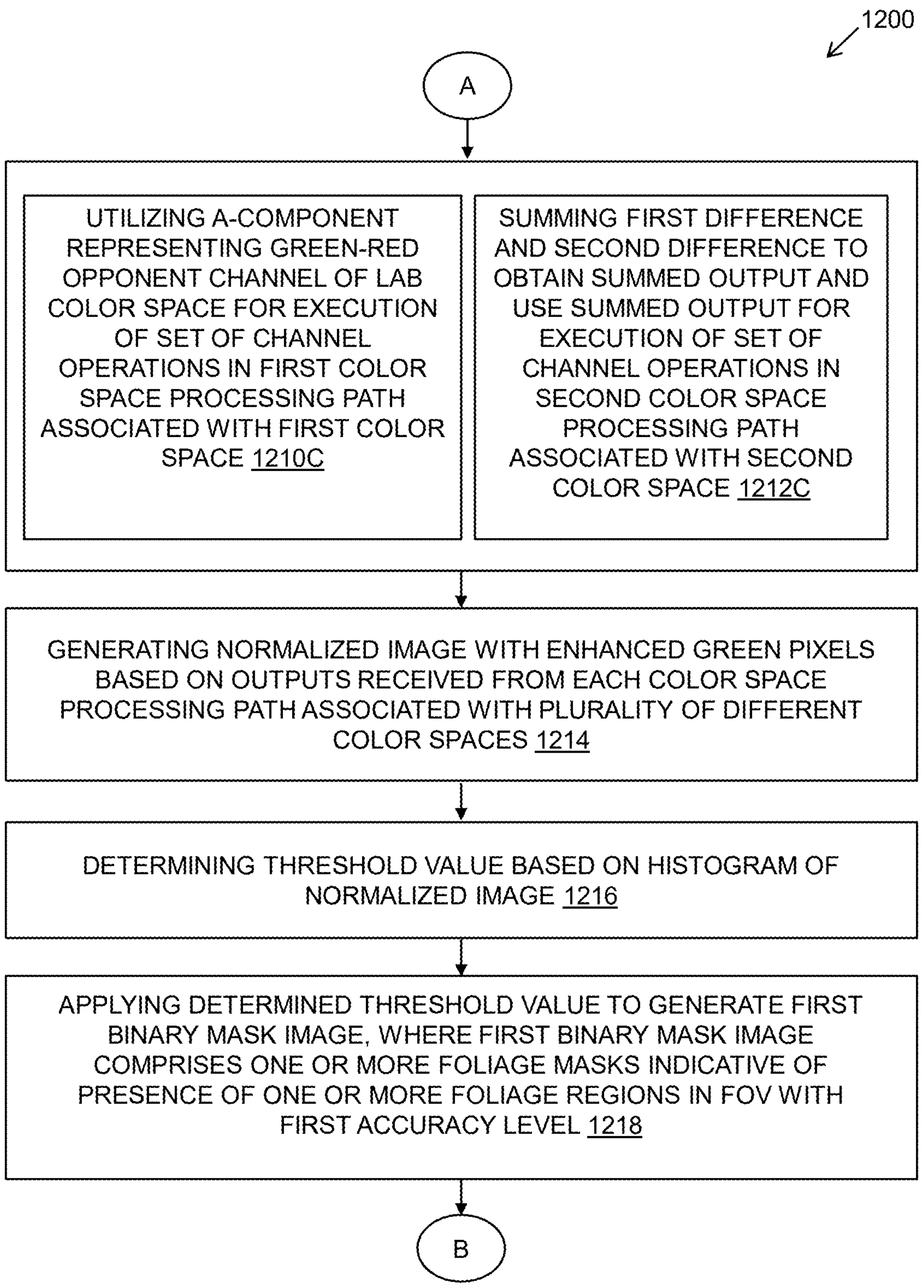

Now referring to FIG. 12B, at 1210C, an A-component representing a green-red opponent channel of the LAB color space is utilized for the execution of the set of channel operations in a first color space processing path associated with the first color space. At 1212C, the first difference (i.e., G−R) and the second difference (i.e., G−B) are summed up to obtain a summed output and use the summed output for the execution of the set of channel operations in a second color space processing path associated with the second color space.

At 1214, a normalized image with enhanced green pixels is generated based on outputs received from each color space processing path associated with the plurality of different color spaces.

At 1216, a threshold value is determined based on a histogram of the normalized image.

At 1218, the determined threshold value is applied to generate a first binary mask image, the first binary mask image comprising one or more foliage masks indicative of a presence of one or more foliage regions in the FOV with a first accuracy level.

Figure 12C:
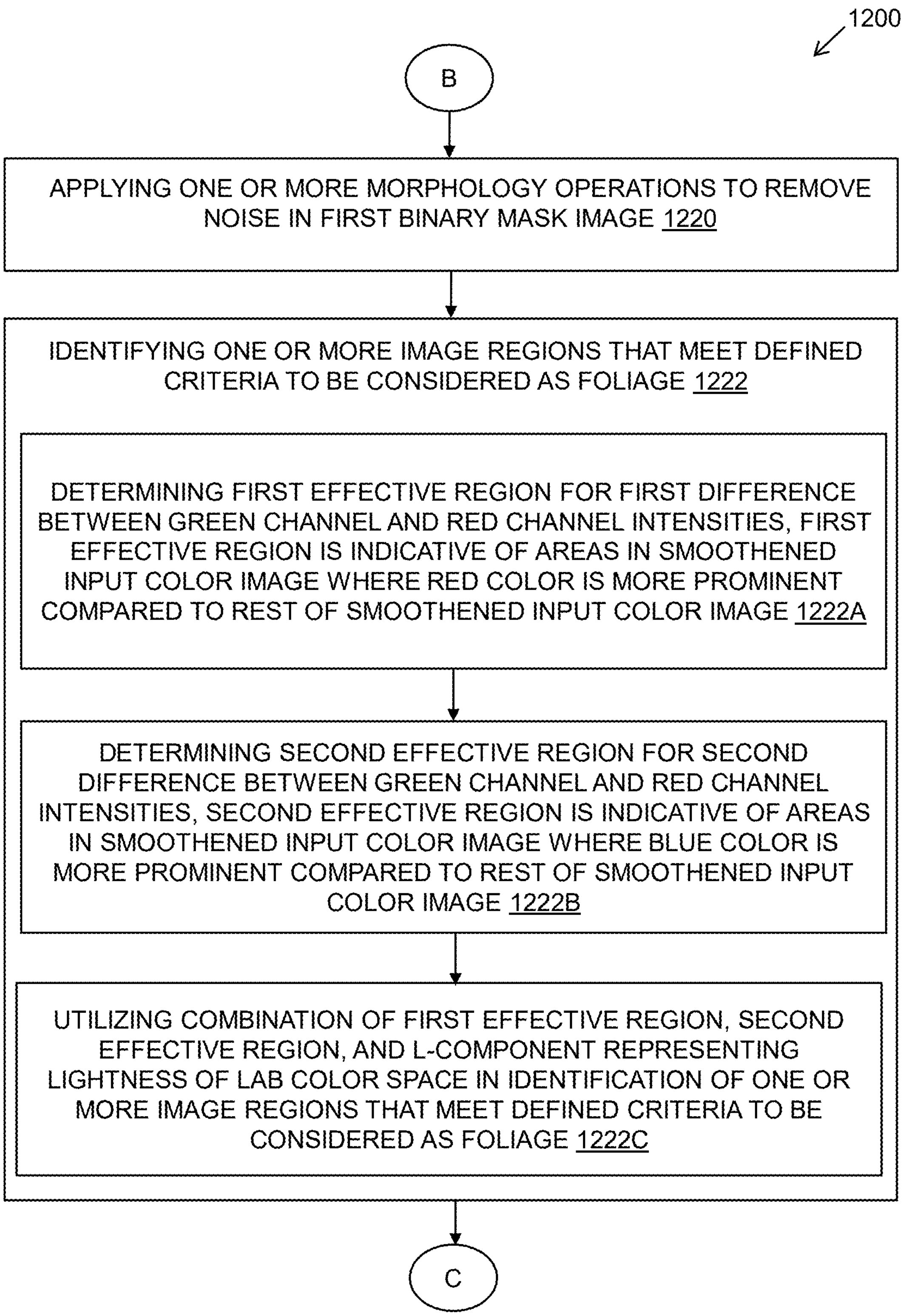

Now referring to FIG. 12C, at 1220, one or more morphology operations are applied to remove noise in the first binary mask image.

At 1222, one or more image regions that meet a defined criteria to be considered as the foliage are identified. The operation 1222 comprises a plurality of sub-operations, such as operations 1222A to 1222D. At 1222A, a first effective region (i.e., effective R region) for the first difference (i.e., G−R) between the green channel and the red channel intensities is determined. The first effective region is indicative of areas in the smoothened input color image where red color is more prominent compared to rest of the smoothened input color image. At 1222B, a second effective region (i.e., effective B region) for the second difference (i.e., G−B) between the green channel and the blue channel intensities is determined. The second effective region is indicative of areas in the smoothened input color image where blue color is more prominent compared to rest of the smoothened input color image. At 1222C, a combination of the first effective region, the second effective region, and the L-component representing lightness of the LAB color space is utilized in the identification of the one or more image regions that meet the defined criteria to be considered as the foliage.

Figure 12D:
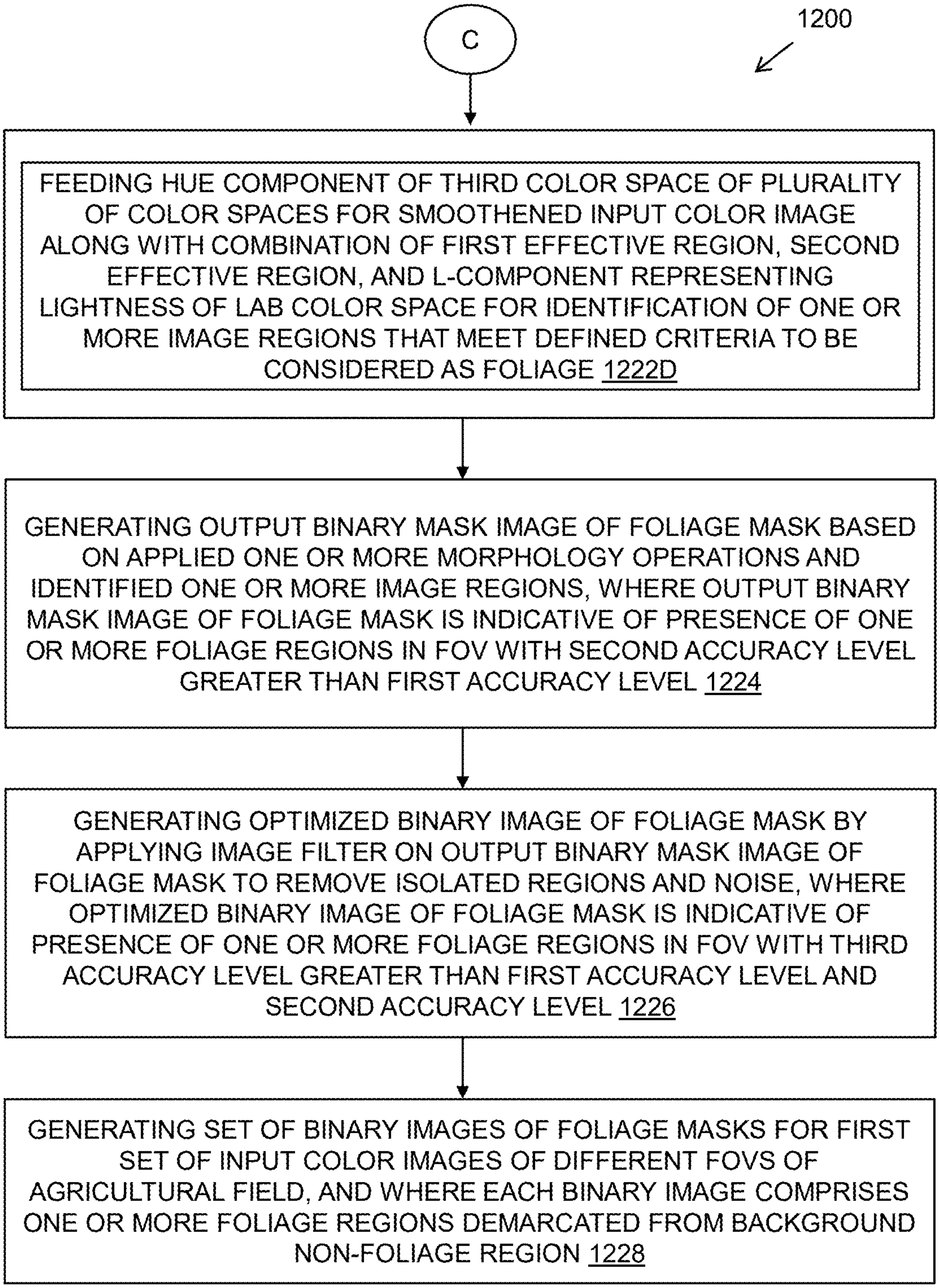

Now referring to FIG. 12D, at 1222D, a hue component of a third color space of the plurality of color spaces for the smoothened input color image is fed along with the combination of the first effective region, the second effective region, and the L-component representing lightness of the LAB color space for the identification of the one or more image regions that meet the defined criteria to be considered as the foliage.

At 1224, an output binary mask image of foliage mask is generated based on the applied one or more morphology operations and the identified one or more image regions. The output binary mask image of foliage mask is indicative of the presence of one or more foliage regions in the FOV with a second accuracy level greater than the first accuracy level.

At 1226, an optimized binary image of foliage mask is generated by applying an image filter on the output binary mask image of foliage mask to remove isolated regions and noise. The optimized binary image of foliage mask is indicative of the presence of one or more foliage regions in the FOV with a third accuracy level greater than the first accuracy level and the second accuracy level.

At 1228, a set of binary images of foliage masks for a first set of input color images of different FOVs of the agricultural field is generated, where each binary image comprises one or more foliage regions demarcated from a background non-foliage region.

The operations 1202 to 1228 are only illustrative and other alternatives can also be provided where one or more operations are added, one or more steps are removed, or one or more operations are provided in a different sequence without departing from the scope of the claims herein.

In one aspect, the present disclosure provides a computer program product comprising program instructions for performing the method 1200, when executed by one or more processors (e.g., the control circuitry 106 of the camera apparatus). In a yet another aspect, the present disclosure provides a non-transitory computer-readable storage medium comprising instructions which, when executed by a computer, cause the computer to carry out the method 1200 of foliage detection.

FIGS. 13A, 13B, 13C, 13D, 13E, and 13F, collectively is a diagram illustrating a flowchart of a method of training and operating a neural network model for foliage detection, in accordance with an embodiment of the present disclosure. FIGS. 13A-13F are described in conjunction with elements from FIGS. 1A-1C, 2A-2D, 3A-3B, 4, 5, 6, 7, 8, 9, 10, 11, and 12A-12D. With reference to FIGS. 13A-13F, there is shown a method 1300 that includes operations 1302 to 1330. The control circuitry 106 of the camera apparatus 102 (of FIG. 1A) is configured to execute the method 1300.

The method 1300 comprises a training phase and an operational phase. The training phase comprises, for example, the operations 1302 to 1314. The operational phase comprises, for example, the operations 1316 to 1330.

Figure 13A:
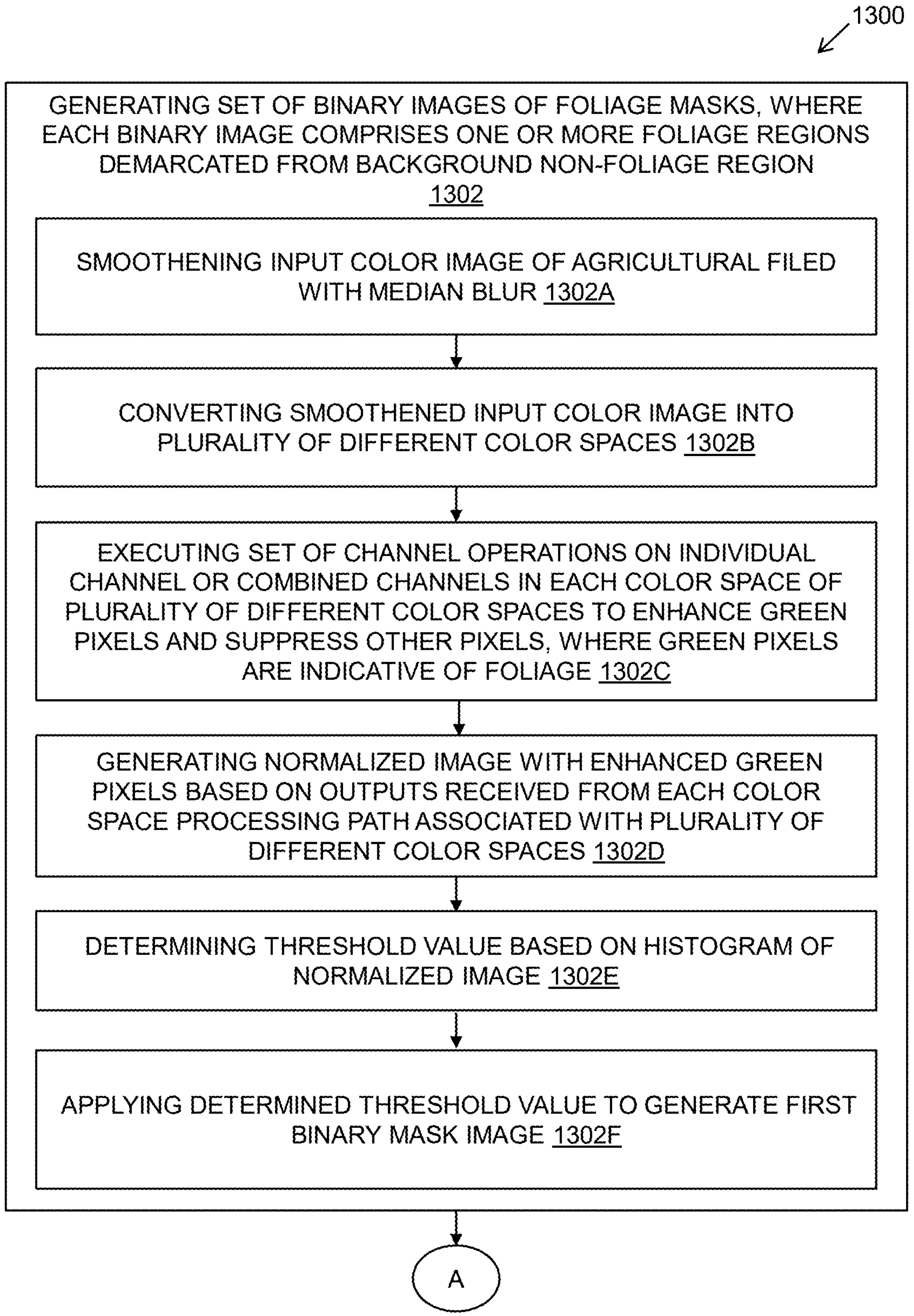
FIGS. 13A, 13B, 13C, 13D, 13E, and 13F, collectively is a diagram illustrating a flowchart of a method of training and operating a neural network model for foliage detection, in accordance with an embodiment of the present disclosure.

Referring to FIG. 13A, at 1302, generating a set of binary images of foliage masks, where each binary image comprises one or more foliage regions demarcated from a background non-foliage region. The operation 1302 comprises a plurality of sub-operations, such as operations 1302A to 1302J. At 1302A, an input color image of an agricultural filed may be smoothened with a median blur. At 1302B, the smoothened input color image may be converted into a plurality of different color spaces. At 1302C, a set of channel operations may be executed on an individual channel or combined channels in each color space of the plurality of different color spaces to enhance green pixels and suppress other pixels, where the green pixels are indicative of foliage. At 1302D, a normalized image may be generated with the enhanced green pixels based on outputs received from each color space processing path associated with the plurality of different color spaces. At 1302E, a threshold value may be determined based on a histogram of the normalized image. At 1302F, the determined threshold value may be applied to generate a first binary mask image.

Figure 13B:
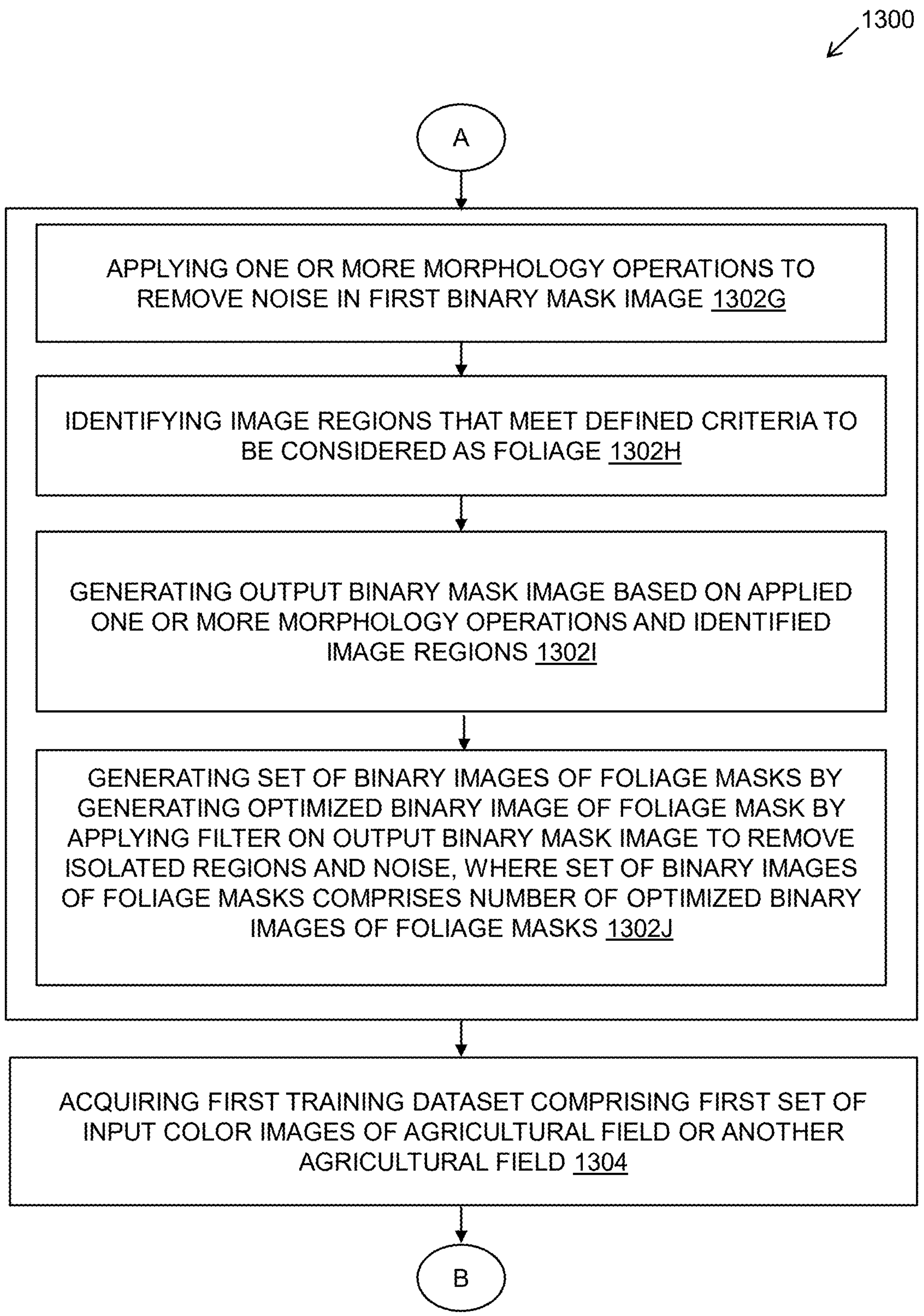

Now referring to FIG. 13B, at 1302G, one or more morphology operations may be applied to remove noise in the first binary mask image. At 1302H, image regions that meet a defined criteria to be considered as foliage may be identified. At 1302I, an output binary mask image may be generated based on the applied one or more morphology operations and the identified image regions. At 1302J, an optimized binary image of foliage mask may be generated by applying filter on the output binary mask image to remove isolated regions and noise, where the set of binary images of foliage masks comprises a number of optimized binary images of foliage masks for corresponding input color images of the agricultural field.

At 1304, a first training dataset may be acquired comprising a first set of input color images of the agricultural field or another agricultural field.

Figure 13C:
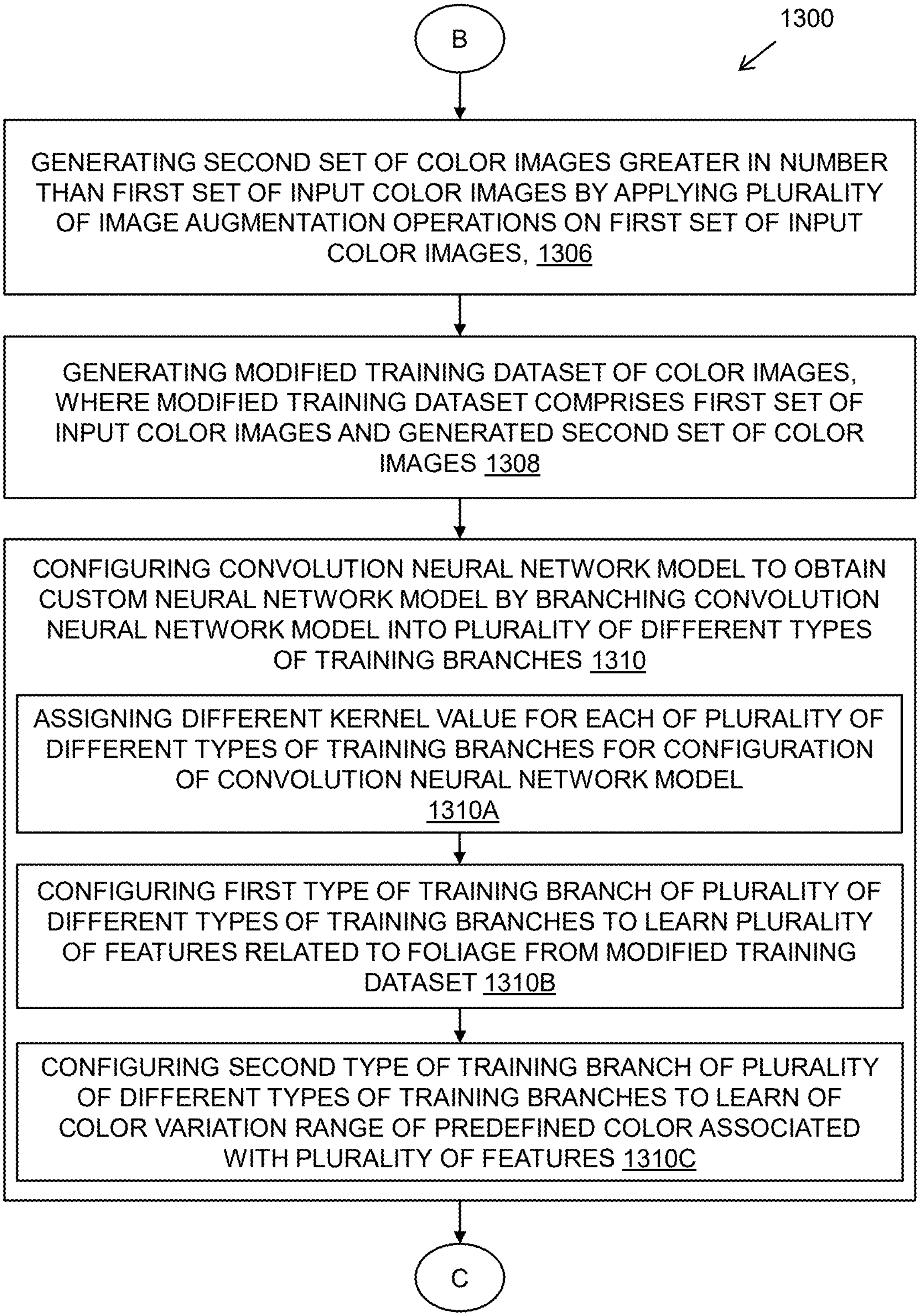

Now referring to FIG. 13C, at 1306, a second set of color images greater in number than the first set of input color images may be generated by applying a plurality of image augmentation operations on the first set of input color images At 1308, a modified training dataset of color images may be generated, where the modified training dataset comprises the first set of input color images and the generated second set of color images.

At 1310, configuring a convolution neural network (CNN) model (i.e., the custom CNN model 500) to obtain the custom neural network model 108A by branching the custom CNN model 500 into a plurality of different types of training branches. The operation 1310 comprises one or more sub-operations, such as operations 1310A to 1310C. At 1310A, a different kernel value may be assigned for each of the plurality of different types of training branches for the configuration of the custom CNN model 500. At 1310B, a first type of training branch of the plurality of different types of training branches may be configured for the learning of a plurality of features related to foliage from the modified training dataset. At 1310C, a second type of training branch of the plurality of different types of training branches may be configured for the learning of the color variation range of the predefined color associated with the plurality of features.

Figure 13D:
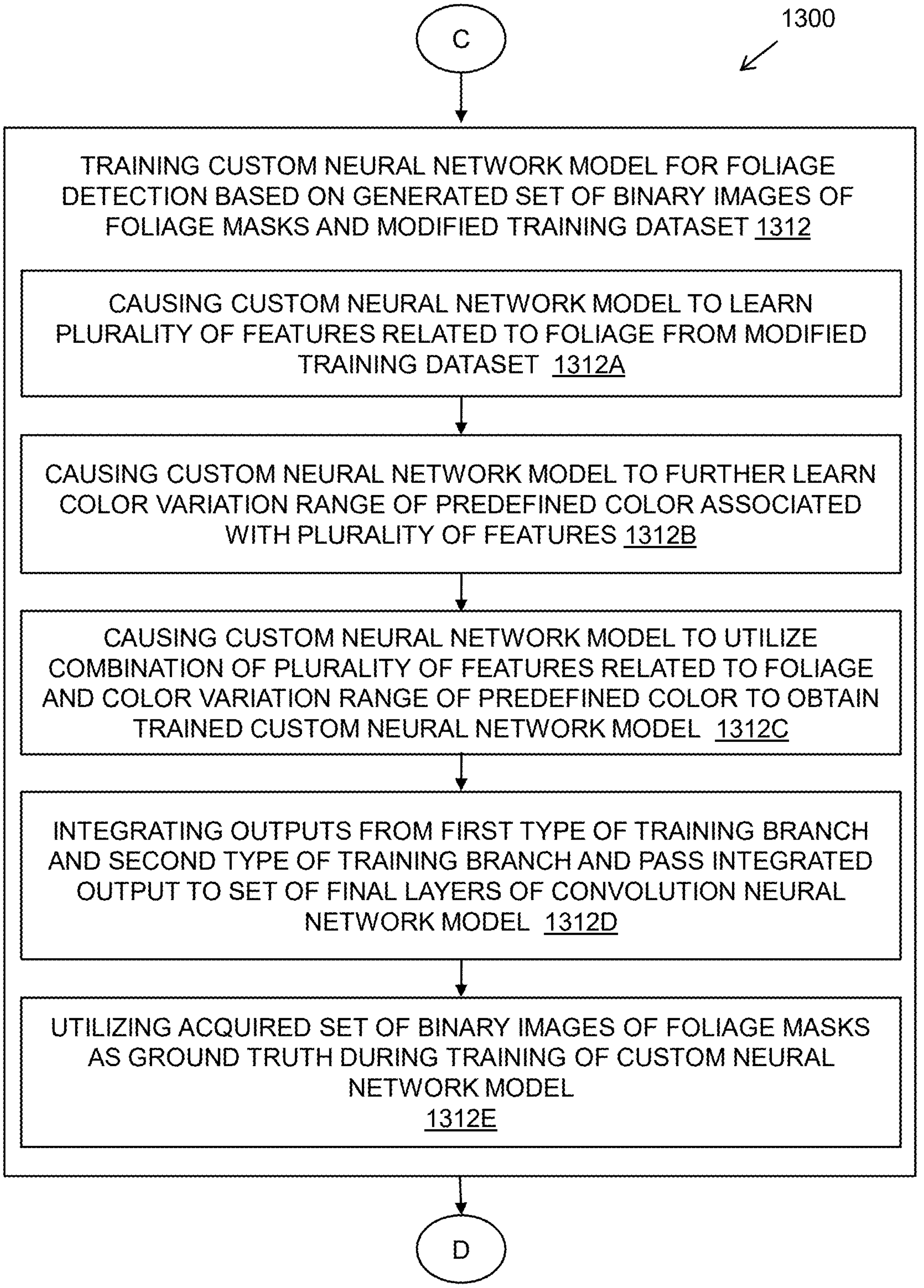

Now referring to FIG. 13D, at 1312, a custom neural network model (i.e., the custom NN model 108A) may be trained for foliage detection based on the generated set of binary images of foliage masks and the modified training dataset. The training of the custom neural network model may include one or more sub-operations, such as operations 1312A to 1312E. At 1312A, the custom NN model 108A may be caused to learn a plurality of features related to foliage from the modified training dataset. At 1312B, the custom NN model 108A may be caused to further learn a color variation range of a predefined color associated with the plurality of features. The predefined color may be a green color, and the color variation range of the predefined color corresponds to a plurality of different shades of the green color. The color variation range of the green color corresponds to different shades of green. Examples of the different shades of green include, but are not limited to green (495 to 570 nm wavelength), lime green (510-560 nm, green with yellowish tinge), spring green (500-530 nm), emerald green (490-520 nm), forest green (480-510 nm), hunter green (470-500 nm, Green with Reddish tinge), sea green (460-490 nm, green with Bluish tinge), Teal (430-460 nm, green with Bluish tinge), olive green (480-520 nm, green with Reddish tinge), moss green (470-500 nm), dark green (450-495 nm), and light green (520-570 nm). At 1312C, the custom NN model 108A may be caused to utilize a combination of the plurality of features related to foliage and the color variation range of the predefined color to obtain a trained custom neural network model (i.e., the trained custom NN model 108B). At 1312D, outputs from the first type of training branch and the second type of training branch may be integrated and integrated output may be passed to a set of final layers of the custom CNN model (e.g., the custom CNN model 500) in the training phase. At 1312E, the generated set of binary images of foliage masks may be utilised as ground truth during training of the custom NN model 108A in the training phase.

Figure 13E:
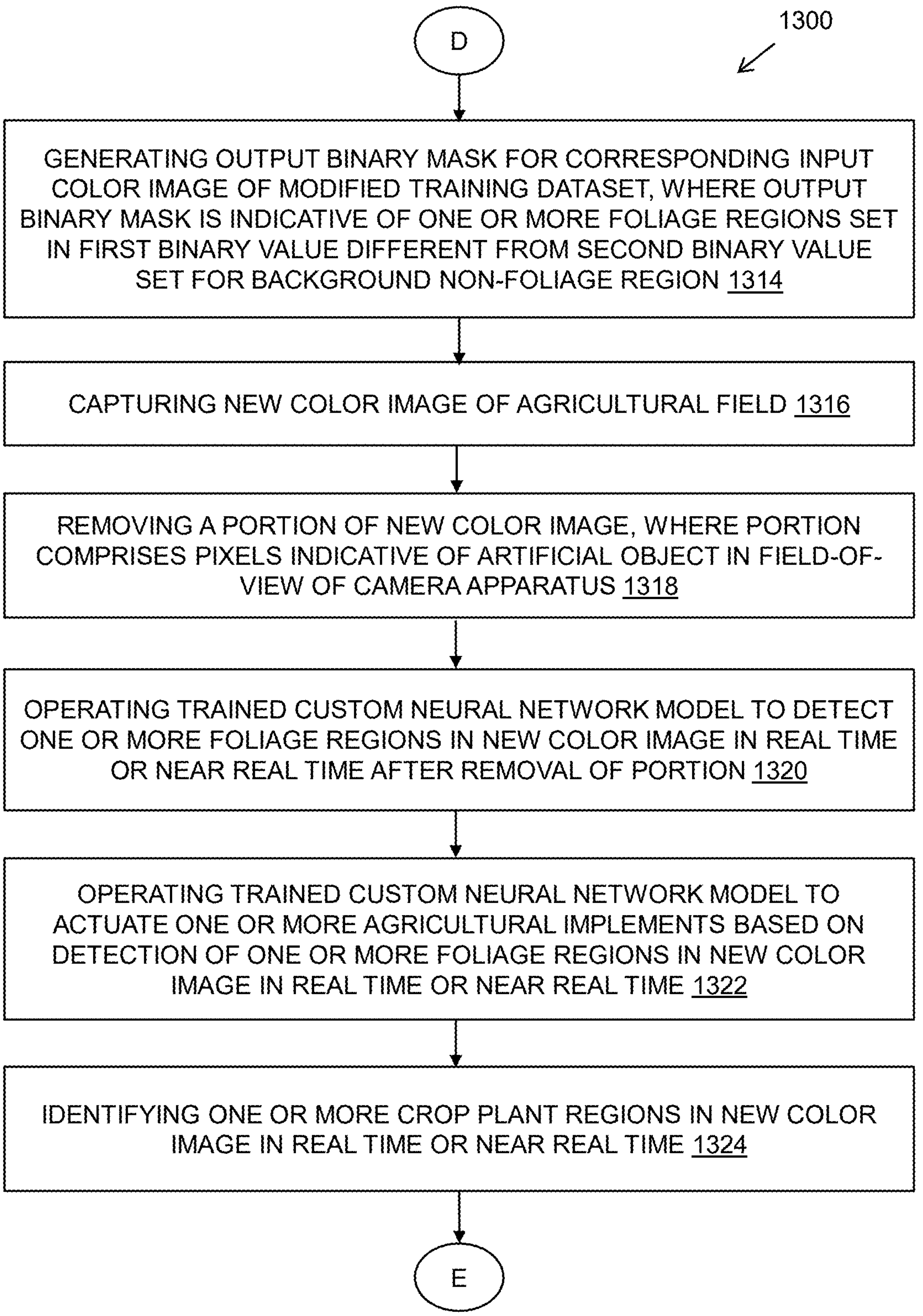

Now referring to FIG. 13E, at 1314, an output binary mask image may be generated for a corresponding input color image of the modified training dataset using the trained custom NN model 108B, where the output binary mask image is indicative of the one or more foliage regions set in a first binary value (e.g., binary value "1") different from a second binary value (e.g., binary value "0") set for the background non-foliage region. For validation and learning, the difference between the generated output binary mask image and a corresponding binary image of foliage mask of the generated set of binary images of foliage masks (from FIP component 120) used as ground truth for same input color image is used as feedback iteratively for several input color images to increase accuracy of prediction in the training phase to obtain the trained custom NN model 108B).

At 1316, a new color image of an agricultural field may be captured in an operational phase. The new color image of the agricultural field is captured in the FOV ranging from 1.7 to 2.5 meters of the agricultural field.

At 1318, a portion of the new color image may be removed, where the portion comprises pixels indicative of an artificial object in a field-of-view (FOV) of the camera apparatus 102.

At 1320, the trained custom NN model 108B may be operated to detect one or more foliage regions in the new color image in a real time or near real time after removal of the portion.

At 1322, the trained custom NN model 108B may be operated to actuate one or more agricultural implements based on the detection of the one or more foliage regions in the new color image in a real time or near real time.

At 1324, one or more crop plant regions may be identified in the new color image in the real time or near real time.

Figure 13F:
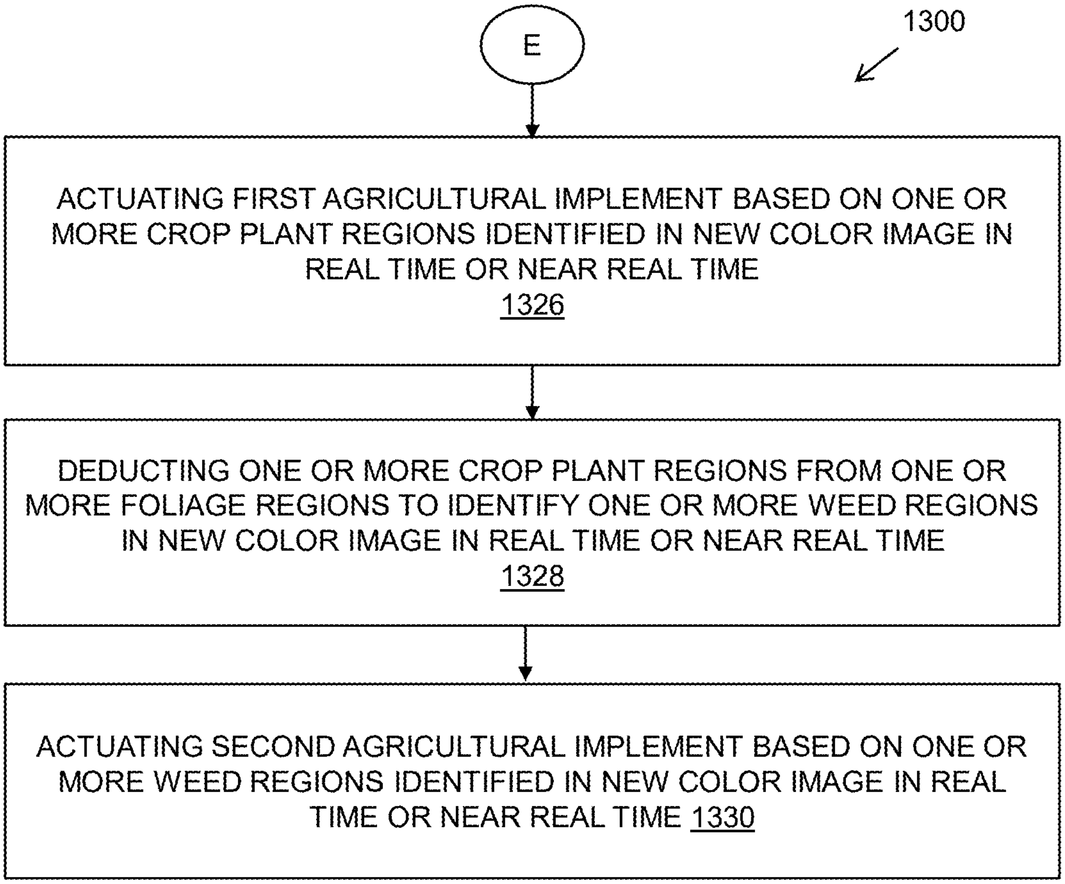

Now referring to FIG. 13F, at 1326, a first agricultural implement may be actuated based on the one or more crop plant regions identified in the new color image in the real time or near real time. Examples of implementation of the first agricultural implement include, but is not limited to a sprayer comprising a plurality of electronically controllable spray nozzles and a cutter comprising a plurality of electronically controllable cutting blades (e.g., for lettuce thinning).

At 1328, the one or more crop plant regions may be deducted from the one or more foliage regions to identify one or more weed regions in the new color image in the real time or near real time.

At 1330, a second agricultural implement may be actuated based on the one or more weed regions identified in the new color image in the real time or near real time. Examples of implementation of the second agricultural implement include, but is not limited to a precision spot sprayer comprising a plurality of electronically controllable spray nozzles for spraying weedicide on the one or more weed regions in the agricultural field and a cutter comprising a plurality of electronically controllable cutting blades (e.g., for uprooting weeds), a laser-based device to emit laser beams on the one or more weed regions, or other means of killing, uprooting, pruning, or dislocating weeds.

The operations 1302 to 1330 are only illustrative and other alternatives can also be provided where one or more operations are added, one or more steps are removed, or one or more operations are provided in a different sequence without departing from the scope of the claims herein.

In one aspect, the present disclosure provides a computer program product comprising program instructions for performing the method 1300, when executed by one or more processors (e.g., the control circuitry 106 of the camera apparatus). In a yet another aspect, the present disclosure provides a non-transitory computer-readable storage medium comprising instructions which, when executed by a computer, cause the computer to carry out the method 1300 of training and operating a neural network model for foliage detection.

While various embodiments described in the present disclosure have been described above, it should be understood that they have been presented by way of example, and not limitation. It is to be understood that various changes in form and detail can be made therein without departing from the scope of the present disclosure. In addition to using hardware (e.g., within or coupled to control circuitry, a central processing unit ("CPU"), microprocessor, micro controller, digital signal processor, processor core, system on chip ("SOC") or any other device), implementations may also be embodied in software (e.g. computer readable code, program code, and/or instructions disposed in any form, such as source, object or machine language) disposed for example in a non-transitory computer-readable medium configured to store the software. Such software can enable, for example, the function, fabrication, modeling, simulation, description and/or testing of the apparatus and methods describe herein. Such software can be disposed in any known non-transitory computer-readable medium, such as semiconductor, magnetic disc, or optical disc (e.g., CD-ROM, DVD-ROM, etc.). The software can also be disposed as computer data embodied in a non-transitory computer-readable transmission medium (e.g., solid state memory or any other non-transitory medium including digital, optical, analog-based medium, such as removable storage media). Embodiments of the present disclosure may include methods of providing the apparatus described herein by providing software describing the apparatus and subsequently transmitting the software as a computer data signal over a communication network including the internet and intranets.

It is to be further understood that the system (i.e., the camera apparatus) described herein may be included in a semiconductor intellectual property core, such as a microcontroller (e.g., embodied in HDL) and transformed to hardware in the production of integrated circuits. Additionally, the system (i.e., the camera apparatus) described herein may be embodied as a combination of hardware and software. Thus, the present disclosure should not be limited by any of the above-described exemplary embodiments but should be defined only in accordance with the following claims and their equivalents.

What is claimed is:

1. A camera apparatus, comprising:

control circuitry configured to:

acquire an input color image of a field-of-view (FOV) of an agricultural field;

generate a first binary mask image from the input color image of the FOV of the agricultural field, wherein the first binary mask image comprises one or more foliage masks indicative of a presence of one or more foliage regions in the FOV with a first accuracy level;

apply one or more morphology operations to remove noise in the first binary mask image;

identify one or more image regions that meet a defined criteria to be considered as foliage; and generate an output binary mask image of foliage mask based on the applied one or more morphology operations and the identified one or more image regions, wherein the output binary mask image of foliage mask is indicative of the presence of one or more foliage regions in the FOV with a second accuracy level greater than the first accuracy level;

set at least the generated output binary mask image of foliage mask as a ground truth to train a custom neural network model in a training phase to obtain a trained custom neural network model; and operate the trained custom neural network model to detect one or more other foliage regions in a new color image captured by the camera apparatus in a real time or near real time in an operational phase.

2. The camera apparatus according to claim 1, wherein the control circuitry is further configured to divide each pixel of the new color image by a defined numerical value of 255 to convert pixel values of the new color image in a binary format.

3. The camera apparatus according to claim 1, wherein the control circuitry is further configured to generate a spray grid corresponding to the new color image, and wherein in the spray grid, the detected one or more other foliage regions are represented by a first binary value and non-foliage regions are represented by a second binary value different from the first binary value, and wherein the first binary value indicates where to spray in the agricultural field and the second binary value indicates where not to spray in the agricultural field.

4. The camera apparatus according to claim 3, wherein the control circuitry is further configured to refine the spray grid to adjust to an actual shape and a location of the detected one or more other foliage regions.

5. The camera apparatus according to claim 1, wherein the custom neural network model is a custom green foliage detection model configured to learn a predefined color and a color variation range of the predefined color.

6. The camera apparatus according to claim 1, wherein the control circuitry is further configured to operate at least one of a plurality of agricultural implements based on the detected one or more other foliage regions in the new color image captured by the camera apparatus in the real time or near real time in the operational phase.

7. The camera apparatus according to claim 1, further comprising an image sensor configured to capture the input color image, wherein the FOV of input color image ranges from 1.75 to 2.25 meters of the agricultural field.

8. The camera apparatus according to claim 1, wherein the control circuitry is further configured to generate an optimized binary image of foliage mask by applying an image filter on the output binary mask image of foliage mask to remove isolated regions and noise, wherein the optimized binary image of foliage mask is indicative of the presence of one or more foliage regions in the FOV with a third accuracy level greater than the first accuracy level and the second accuracy level.

9. The camera apparatus according to claim 1, wherein the control circuitry is further configured to apply a median blur to the input color image to smoothen illumination differences at time of capture of the input color image to obtain a smoothened input color image.

10. The camera apparatus according to claim 9, wherein the control circuitry is further configured to convert the smoothened input color image into a plurality of different color spaces.

11. The camera apparatus according to claim 10, wherein the control circuitry is further configured to execute a set of channel operations on an individual channel or combined channels in each color space of the plurality of different color spaces to enhance green pixels and suppress other pixels, wherein the green pixels are indicative of foliage in the FOV.

12. The camera apparatus according to claim 11, wherein the control circuitry is further configured to generate a normalized image with enhanced green pixels based on outputs received from each color space processing path associated with the plurality of different color spaces.

13. The camera apparatus according to claim 12, wherein the control circuitry is further configured to determine a threshold value based on a histogram of the normalized image.

14. The camera apparatus according to claim 13, wherein the control circuitry is further configured to examine a distribution of pixel values in the normalized image to find a cutoff point that separates foliage pixels from non-foliage pixels for the determination of the threshold value, and wherein the determined threshold value is applied to generate the first binary mask image.

15. The camera apparatus according to claim 1, further comprising:

- a first printed circuit board (PCB) configured as an image sensing and light control board comprising an image sensor, a plurality of capacitors, and a plurality of light sources, wherein the plurality of light sources are disposed around the image sensor at two or more concentrated regions and powered by the plurality of capacitors;
- a second PCB configured as a motherboard comprising a storage device and the control circuitry integrated in the second PCB; and
- a third PCB configured as a power supply board to power components of the first PCB and the second PCB.

16. A method of foliage detection, comprising:

in a camera apparatus:

- acquiring an input color image of a field-of-view (FOV) of an agricultural field;
- generating a first binary mask image from the input color image of the FOV of the agricultural field, wherein the first binary mask image comprises one or more foliage masks indicative of a presence of one or more foliage regions in the FOV with a first accuracy level;
- applying one or more morphology operations to remove noise in the first binary mask image;
- identifying one or more image regions that meet a defined criteria to be considered as foliage; and
- generating an output binary mask image of foliage mask based on the applied one or more morphology operations and the identified one or more image regions, wherein the output binary mask image of foliage mask is indicative of the presence of one or more foliage regions in the FOV with a second accuracy level greater than the first accuracy level;
- setting at least the generated output binary mask image of foliage mask as a ground truth during training of a custom neural network model in a training phase to obtain a trained custom neural network model; and
- operating the trained custom neural network model to detect one or more other foliage regions in a new color image captured by the camera apparatus in a real time or near real time in an operational phase.

17. The method according to claim 16, further comprising dividing each pixel of the new color image by a defined numerical value of 255 to convert pixel values of the new color image in a binary format.

18. The method according to claim 16, further comprising generating a spray grid corresponding to the new color image, and wherein in the spray grid, the detected one or more other foliage regions are represented by a first binary value and non-foliage regions are represented by a second binary value different from the first binary value, and wherein the first binary value indicates where to spray in the agricultural field and the second binary value indicates where not to spray in the agricultural field.

19. The method according to claim 18, further comprising refining the spray grid to adjust to an actual shape and a location of the detected one or more other foliage regions.

20. The method according to claim 16, further comprising learning, by the custom neural network model, a predefined color and a color variation range of the predefined color in the training phase.

* * * * *